US009966545B2

United States Patent
Kim et al.

(10) Patent No.: US 9,966,545 B2
(45) Date of Patent: May 8, 2018

(54) ANTHRACENE-BASED COMPOUNDS AND ORGANIC LIGHT-EMITTING DEVICE INCLUDING THE SAME

(71) Applicants: SAMSUNG DISPLAY CO., LTD., Yongin, Gyeonggi-Do (KR); Industry-Academic Cooperation Foundation Gyeongsang National University, Gyeongnam (KR)

(72) Inventors: Mi-Kyung Kim, Yongin (KR); Chang-Woong Chu, Yongin (KR); Se-Hun Kim, Yongin (KR); Dong-Hyun Kim, Yongin (KR); Yun-Hi Kim, Gyeongnam (KR); Soon-Ki Kwon, Gyeongnam (KR); Yun-ji Lee, Gyeongnam (KR)

(73) Assignees: SAMSUNG DISPLAY CO., LTD., Yongin-si, Gyeobnggi-do (KR); INDUSTRY-ACADEMIC COOPERATION FOUNDATION GYEONGSANG NATIONAL UNIVERSITY, Jinju, Gyeongnam (KR)

( * ) Notice: Subject to any disclaimer, the term of this patent is extended or adjusted under 35 U.S.C. 154(b) by 769 days.

(21) Appl. No.: 14/326,626

(22) Filed: Jul. 9, 2014

(65) Prior Publication Data

US 2015/0053946 A1 Feb. 26, 2015

(30) Foreign Application Priority Data

Aug. 22, 2013 (KR) .......................... 10-2013-0099885

(51) Int. Cl.
*H01L 51/54* (2006.01)
*C09K 11/06* (2006.01)
(Continued)

(52) U.S. Cl.
CPC ...... *H01L 51/0094* (2013.01); *H01L 51/0054* (2013.01); *H01L 51/0058* (2013.01); *H01L 51/5012* (2013.01)

(58) Field of Classification Search
CPC ............... H01L 51/0032; H01L 51/005; H01L 51/0052; H01L 51/0058; H01L 51/0094;
(Continued)

(56) References Cited

U.S. PATENT DOCUMENTS

2009/0236975 A1* 9/2009 Ito .......................... C07F 7/0809
313/504
2010/0237330 A1* 9/2010 Lee ........................ C09K 11/06
257/40
2014/0054558 A1 2/2014 Kim et al.

FOREIGN PATENT DOCUMENTS

CN 103102877 A 5/2013
JP 2009-040765 A 2/2009
(Continued)

OTHER PUBLICATIONS

Lee et al. Journal of Organometallic Chemistry 2006, 691, 1887-1896. Year of publication: 2006.*
(Continued)

*Primary Examiner* — Andrew K Bohaty
(74) *Attorney, Agent, or Firm* — Lee & Morse, P.C.

(57) ABSTRACT

Embodiments are directed to an anthracene-based compound and an organic light-emitting device. The anthracene-based compound is represented by Formula 1:
(Continued)

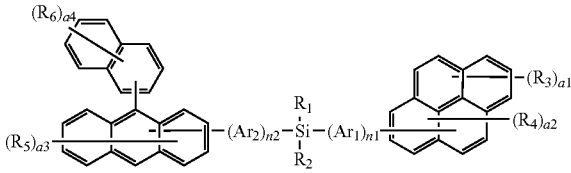

<Formula 1>

Substituents of Formula 1 are described in the specification. The organic light-emitting device may include a first electrode, a second electrode opposite to the first electrode, and an organic layer between the first and second electrodes and including an emission layer. The organic layer may include at least one anthracene-based compound of Formula 1.

9 Claims, 5 Drawing Sheets

(51) Int. Cl.
*H01L 51/00* (2006.01)
*H01L 51/50* (2006.01)

(58) Field of Classification Search
CPC . H01L 51/50; H01L 51/5012; H01L 51/5016; H01L 51/5056; C07C 13/28; C07C 13/573; C07C 13/58; C07C 15/00; C07C 15/20; C07C 15/24; C07C 15/27; C07C 15/28; C07C 2103/00; C07C 2103/22; C07C 2103/24
USPC ....... 428/690, 691, 917, 411.4, 336; 427/58, 427/66; 313/500–512; 257/40, 88–104, 257/E51.001–E51.052; 252/301.16–301.35; 556/489
See application file for complete search history.

(56) References Cited

FOREIGN PATENT DOCUMENTS

| | | |
|---|---|---|
| JP | 2012-119592 A | 6/2012 |
| KR | 10-2014-0026682 A | 3/2014 |

OTHER PUBLICATIONS

Park et al. Organic Electronics 2010, 11, 905-915. (Year: 2010).*
Chinese Office Action dated Nov. 27, 2017.

* cited by examiner

ANTHRACENE-BASED COMPOUNDS AND ORGANIC LIGHT-EMITTING DEVICE INCLUDING THE SAME

CROSS-REFERENCE TO RELATED APPLICATION

The present application claims priority under 35 U.S.C. § 119 to Korean Patent Application No. 10-2013-0099885, filed on Aug. 22, 2013, in the Korean Intellectual Property Office, and entitled: "Anthracene-Based Compounds and Organic Light-Emitting Device Including The Same," which is incorporated by reference herein in its entirety.

BACKGROUND

1. Field

Embodiments relate to an anthracene-based compound and an organic light-emitting device including the anthracene-based compound.

2. Description of the Related Art

Organic light-emitting devices (OLEDs) are self-emitting devices that have advantages such as wide viewing angles, excellent contrast, quick responses, high brightness, excellent driving voltage characteristics, and provision of multi-colored images. A typical OLED may have a structure including and an anode, a hole transport layer (HTL), an emission layer (EML), an electron transport layer (ETL), and a cathode, which are sequentially stacked in this order on a substrate. The HTL, the EML, and the ETL are organic thin films that may include organic compounds. When a voltage is applied between the anode and the cathode, for example, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments are directed to an anthracene-based compound represented by Formula 1:

a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ cycloalkyl group, a substituted or unsubstituted $C_1$-$C_{30}$ heterocycloalkyl group, a substituted or unsubstituted $C_3$-$C_{30}$ cycloalkenyl group, a substituted or unsubstituted $C_1$-$C_{30}$ heterocycloalkenyl group, a substituted or unsubstituted $C_6$-$C_{30}$ aryl group, and a substituted or unsubstituted $C_1$-$C_{30}$ heteroaryl group; a1 is an integer from 0 to 5; a2 is an integer from 0 to 4; a3 is an integer from 0 to 8; and a4 is an integer from 0 to 7.

An organic light-emitting device may include a first electrode, a second electrode opposite to the first electrode, and an organic layer between the first and second electrodes and including an emission layer. The organic layer may include at least one anthracene-based compound of Formula 1.

BRIEF DESCRIPTION OF THE DRAWINGS

These and/or other aspects will become apparent and more readily appreciated from the following description of the embodiments, taken in conjunction with the accompanying drawings in which.

<Formula 1>

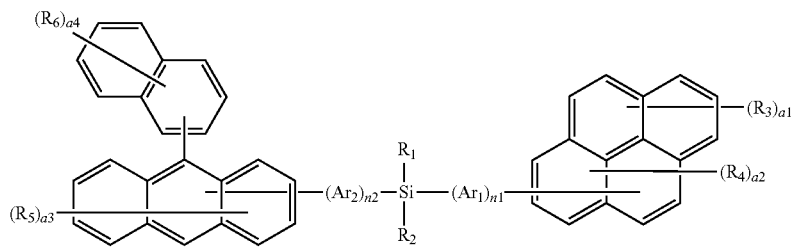

Figure 7:
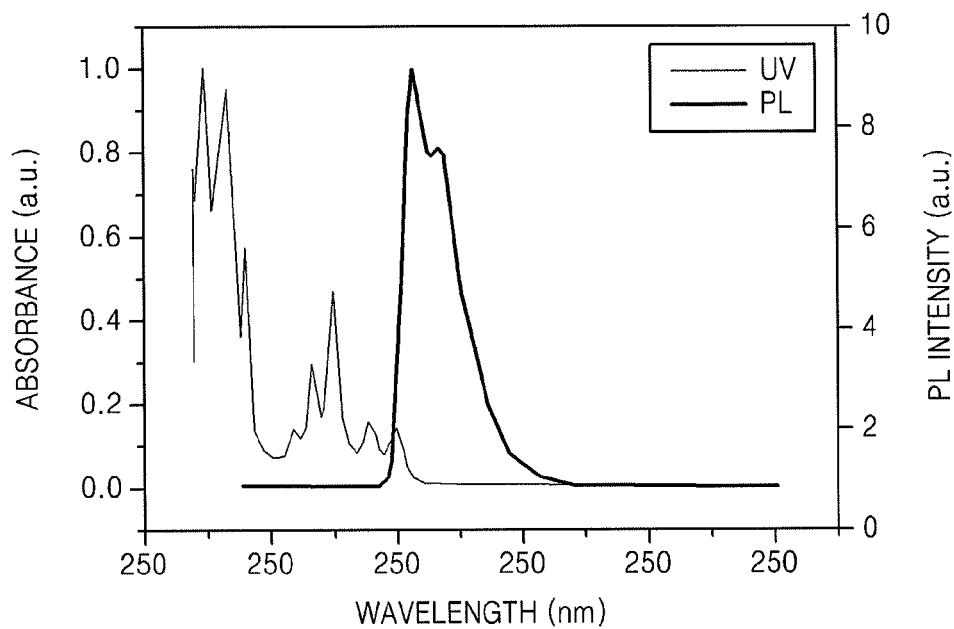
Figure 8:
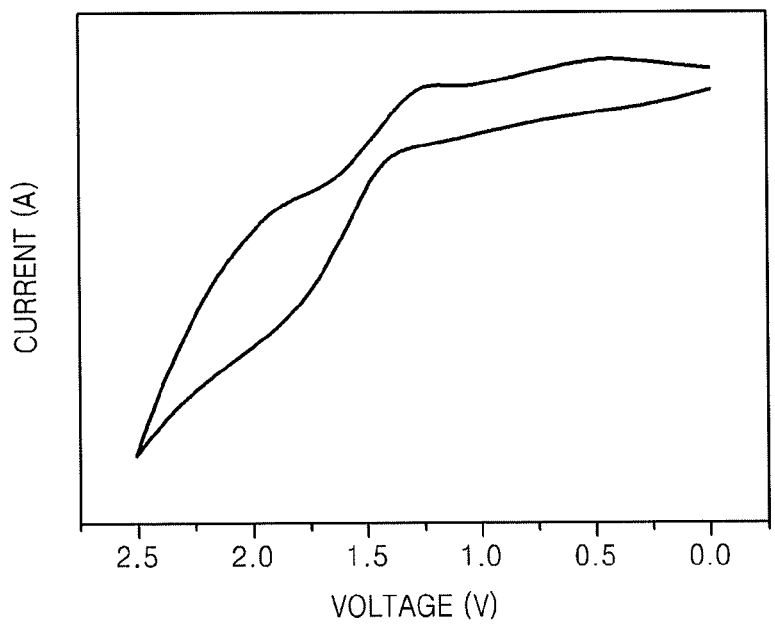

wherein, in Formula 1, $Ar_1$ and $Ar_2$ are each independently selected from a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroarylene group; n1 and n2 are each independently an integer from 0 to 3; a sum of n1 and n2 is 1 or greater; $R_1$ to $R_6$ are each independently selected from a hydrogen atom, a deuterium atom, a halogen atom, FIG. 7 illustrates a graph of UV absorption spectra and PL spectra of Compound 25 in solution;

FIG. 8 illustrates a graph of results of cyclic voltammetry on Compound 1; and

Figure 9:
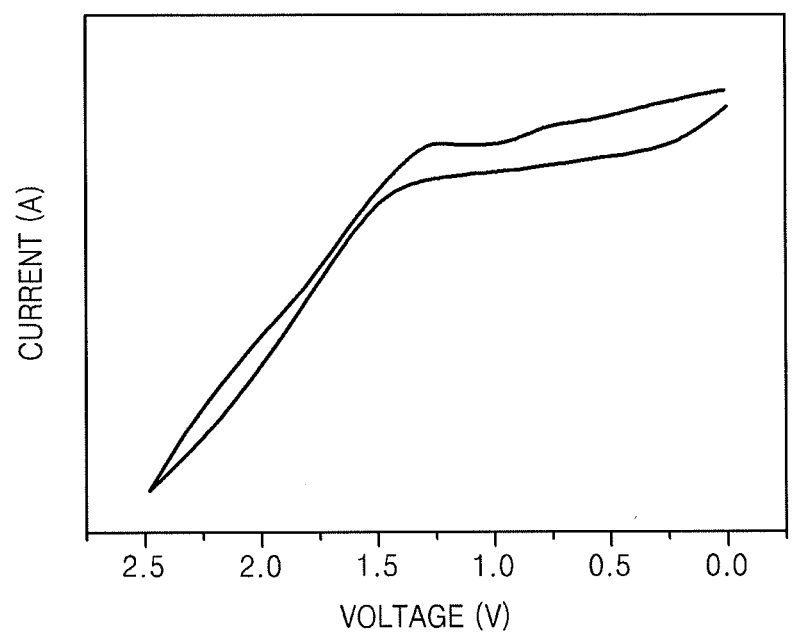

FIG. 9 illustrates a graph of results of cyclic voltammetry on Compound 25.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

An anthracene-based compound is provided represented by Formula 1:

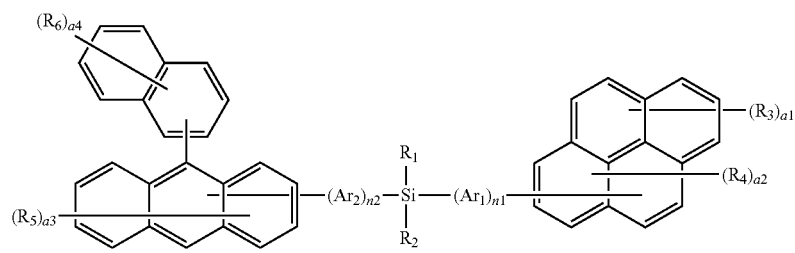

<Formula 1>

In Formula 1, $Ar_1$ and $Ar_2$ may be each independently selected from a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroarylene group. For example, $Ar_1$ and $Ar_2$ in Formula 1 may be each independently selected, for example, from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzopuranylene group, a substituted or unsubstituted dibenzothiophenylene group, and a substituted or unsubstituted benzocarbazolylene group.

$Ar_1$ and $Ar_2$ in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, and a $C_1$-$C_{30}$ alkyl group; a $C_1$-$C_{30}$ alkyl group substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_6$-$C_{30}$ aryl group and a $C_1$-$C_{30}$ heteroaryl group; and a $C_6$-$C_{60}$ aryl group and a $C_1$-$C_{60}$ heteroaryl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_6$-$C_{60}$ aryl group, and a $C_1$-$C_{60}$ heteroaryl group.

$Ar_1$ and $Ar_2$ in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; and a methyl group, an ethyl group, a n-propyl group, an iso-propyl group, a n-butyl group, a sec-butyl group, an iso-butyl group, and a tert-butyl group, each substituted with at least one of a deuterium atom, a halogen atom, a hydroxyl group, a cyano group, and a nitro group.

Ar1 and Ar2 in Formula 1 may be each independently selected, for example, from i) a phenylene group, a naphthylene group, and an anthracenylene group; and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group.

In Formulas 1, n1, which indicates the number of Ar1s, may be an integer from 0 to 3 When n1 is an integer of 2 or greater, for example, n1 number of Ar1s may be identical to or different from each other. In Formula 1, n2, which indicates the number of Ar2s, may be, for example, an integer from 0 to 3. When n2 is an integer of 2 or greater, for example, n2 number of Ar2s may be identical to or different from each other. For example, n1 and n2 in Formula 1 may be each independently an integer from 0 to 2. Other integers may be used for n1 and/or n2. In Formula 1, a sum of n1 and n2 may be 1 or greater. That is, at least one Ar2 may be between a Si atom and an anthracene ring, or at least one Ar1 may be between a Si atom and a pyrene ring. For example, n1 in Formula 1 may be an integer of 0, and n2 may be an integer of 1 or 2. Other integers may be used for n1 and/or n2. For example, $(Ar1)_{n1}$ and $(Ar2)_{n2}$ in Formula 1 may be each independently one selected from groups represented by Formulae 3-1 to 3-11, for example:

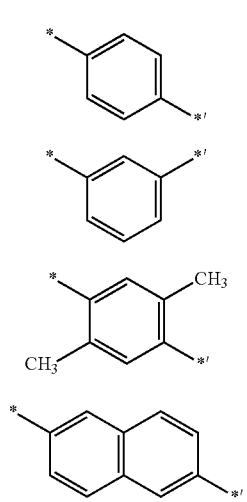

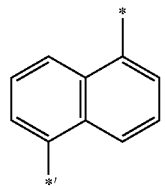

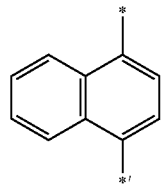

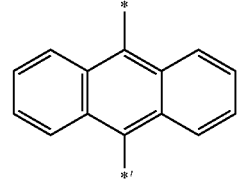

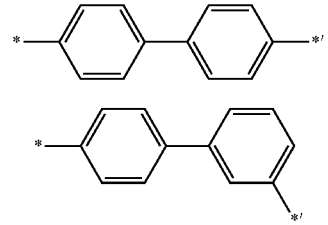

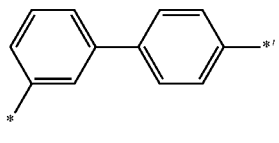

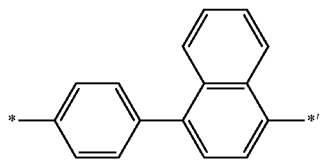

In Formulae 3-1 to 3-11, * indicates a binding site to an anthracene ring, and *' indicates a binding site to a Si atom. For example, $R_1$ to $R_6$ in Formula 1 may be each independently selected from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_3$-$C_{30}$ cycloalkyl group, a substituted or unsubstituted $C_1$-$C_{30}$ heterocycloalkyl group, a substituted or unsubstituted $C_3$-$C_{30}$ cycloalkenyl group, a substituted or unsubstituted $C_1$-$C_{30}$ heterocycloalkenyl group, a substituted or unsubstituted $C_6$-$C_{30}$ aryl group, and a substituted or unsubstituted $C_1$-$C_{30}$ heteroaryl group.

For example, $R_1$ and $R_2$ in Formula 1 may be each independently selected, for example, from a deuterium atom, a halogen atom, a cyano group, a nitro group, a substituted or unsubstituted methyl group, a substituted or unsubstituted ethyl group, a substituted or unsubstituted n-propyl group, a substituted or unsubstituted i-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted pentyl group, a substituted or unsubstituted hexyl group, a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, and a substituted or unsubstituted hexacenyl group.

$R_1$ and $R_2$ in Formula 1 may be each independently selected, for example, from i) a methyl group, an ethyl group, and an n-propyl group; ii) a methyl group, an ethyl group, and an n-propyl group, each substituted with a deuterium atom, a halogen atom, a cyano group, and a nitro group; iii) a phenyl group, a naphthyl group, and an anthryl group; and iv) a phenyl group, a naphthyl group, and an anthryl group, each substituted with at least one of a deuterium atom, a halogen atom, a cyano group, a nitro group, a methyl group, an ethyl group, and an n-butyl group.

$R_1$ and $R_2$ in Formula 1 may be each independently selected, for example, from a methyl group, an ethyl group, a phenyl group, and 2-naphthyl group. For example, $R_3$ to $R_6$ in Formula 1 may be each independently selected, for example, from a hydrogen atom, a deuterium atom, a halogen atom, a hydroxyl group, a cyano group, and a nitro group. In Formula 1, a1, which indicates the number of $R_3$s, may be an integer from 0 to 5. In Formula 1, a2, which indicates the number of $R_4$s, may be an integer from 0 to 8. For example, when a2 in Formula 1 is 0, the anthracene ring is not substituted. In Formula 1, a3, which indicates the number of $R_5$s, may be an integer from 0 to 4. For example, when a1 and a2 in Formula 1 are both 0, the pyrene ring is not substituted. In Formula 1, a3, which indicates the number of $R_5$s, may be an integer from 0 to 8. For example, when a3 in Formula 1 is 0, the anthracene ring is not substituted. In Formula 1, a4, which indicates the number of $R_6$s, may be an integer from 0 to 7. For example, when a4 in Formula 1 is 0, the naphthalene ring is not substituted. The anthracene-based compound of Formula 1 may be a compound represented by Formula 1a or 1b, for example:

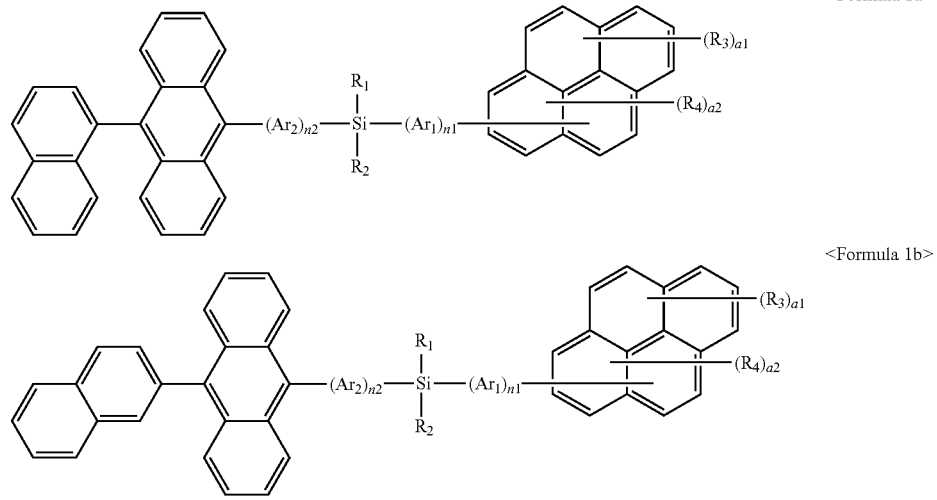

<Formula 1a>

<Formula 1b>

In Formulae 1a and 1b, $Ar_1$ and $Ar_2$ may be each independently selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; n1 and n2 may be each independently an integer from 0 to 2; a sum of n1 and n2 may be 1 or greater; and $R_1$ and $R_2$ may be each independently selected from i) a methyl group, an ethyl group, and an n-propyl group, ii) a methyl group, an ethyl group, and an n-propyl group, each substituted with a deuterium atom, a halogen atom, a cyano group, and a nitro group, iii) a phenyl group, a naphthyl group, and an anthryl group, and iv) a phenyl group, a naphthyl group, and an anthryl group, each substituted with at least one of a deuterium atom, a halogen atom, a cyano group, a nitro group, a methyl group, an ethyl group, and an n-butyl group; $R_3$ and $R_4$ may be each independently selected from a hydrogen atom, a deuterium atom, a halogen atom, a hydroxyl group, a cyano group, and a nitro group; a1 may be an integer from 0 to 5; and a2 may be an integer from 0 to 4. The anthracene-based compound of Formula 1 may be a compound represented by Formula 1a or 1b, for example:

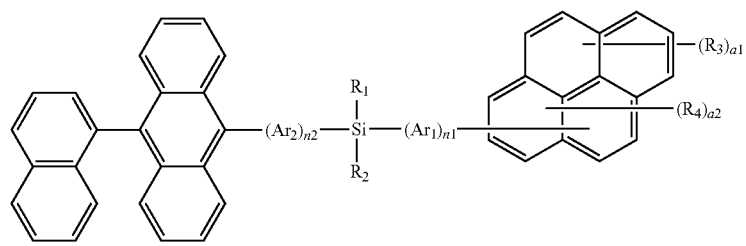

<Formula 1a>

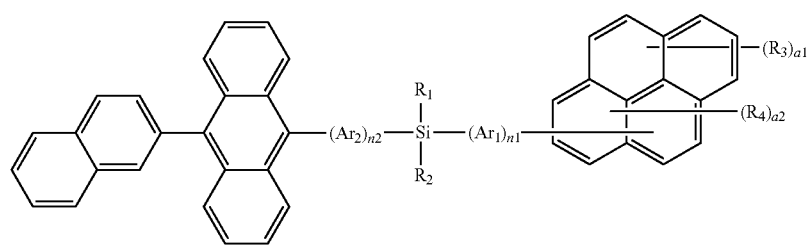

<Formula 1b>

In Formulae 1a and 1b, $Ar_1$ and $Ar_2$ may be each independently selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; n1 and n2 may be each independently an integer from 0 to 2; a sum of n1 and n2 may be 1 or greater; $R_1$ and $R_2$ may be each independently selected from i) a methyl group, an ethyl group, and an n-propyl group, ii) a methyl group, an ethyl group, and an n-propyl group, each substituted with at least one selected from a deuterium atom, a halogen atom, a cyano group, and a nitro group, iii) a phenyl group, a naphthyl group, and an anthryl group, and iv) a phenyl group, a naphthyl group, and an anthryl group, each substituted with at least one selected from a deuterium atom, a halogen atom, a cyano group, a nitro group, a methyl group, an ethyl group, and an n-propyl group; $R_3$ and $R_4$ may be each independently selected from a hydrogen atom, a deuterium atom, a halogen atom, a hydroxyl group, a cyano group, and a nitro group; a1 may be an integer from 0 to 5; and a2 may be an integer from 0 to 4.

The anthracene-based compound of Formula 1 may be a compound represented by Formula 1a or 1b, for example:

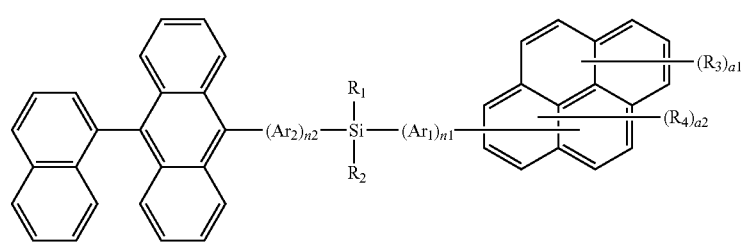

<Formula 1a>

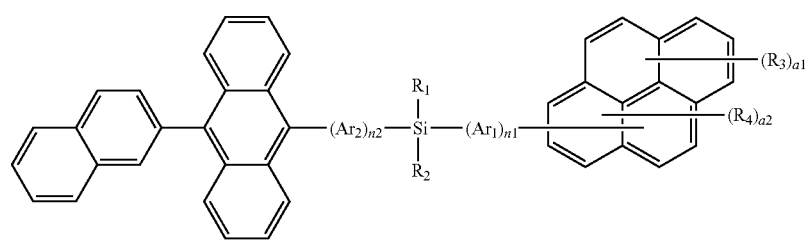

<Formula 1b>

In Formulae 1a and 1b, $(Ar_1)_{n1}$ and $(Ar_2)_{n2}$ may be each independently selected from groups represented by Formulae 3-1 to 3-11:

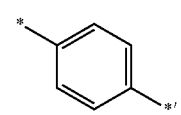

3-1

-continued

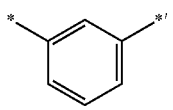
3-2

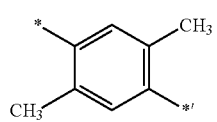
3-3

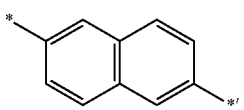
3-4

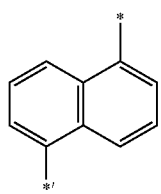
3-5

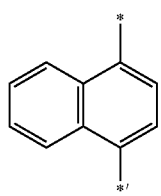
3-6

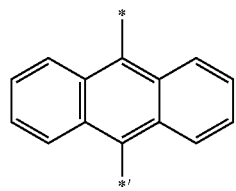
3-7

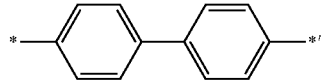
3-8

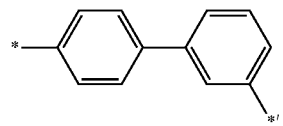
3-9

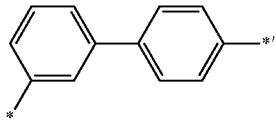
3-10

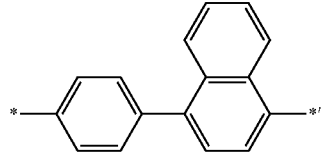
3-11

In Formulae 3-1 to 3-11, * may be a binding site to an anthracene ring; *' may be a binding site to a Si atom; $R_1$ and $R_2$ may be each independently selected from a methyl group, an ethyl group, a phenyl group, and 2-naphthyl group; $R_3$ and $R_4$ may be each independently selected from a hydrogen atom, a deuterium atom, a halogen atom, a hydroxyl group, a cyano group, and a nitro group; a1 may be an integer from 0 to 6; and a2 may be an integer from 0 to 4. The anthracene-based compound of Formula 1 may be a compound represented by one of Formulae 1c to 1 h, for example:

<Formula 1c>

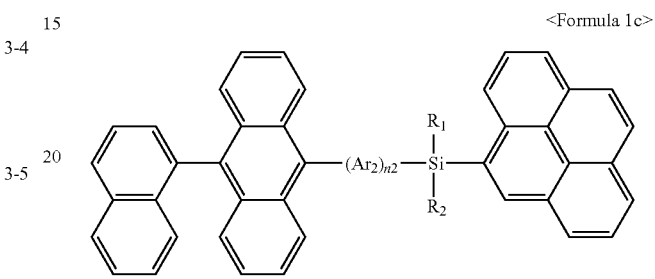

<Formula 1d>

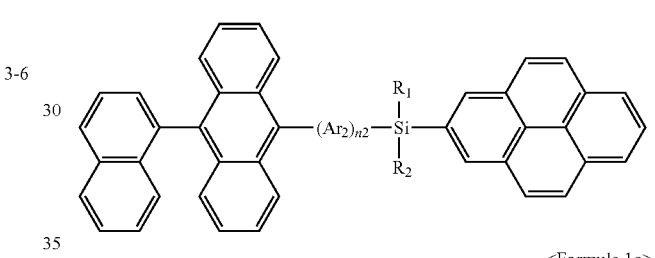

<Formula 1e>

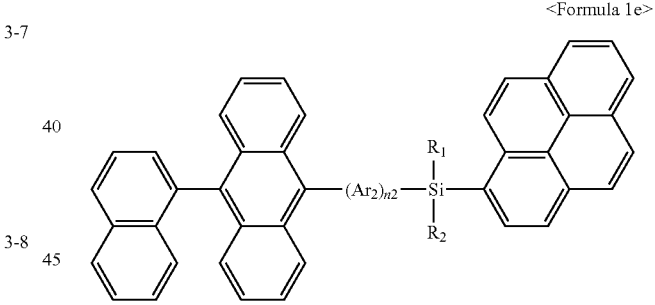

<Formula 1f>

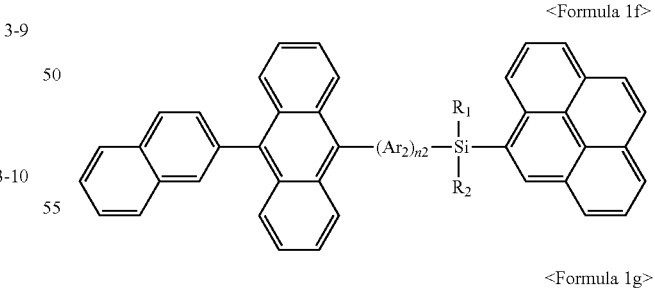

<Formula 1g>

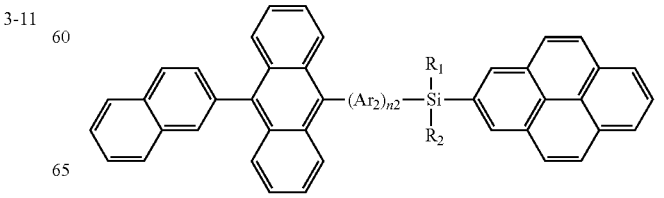

<Formula 1h>

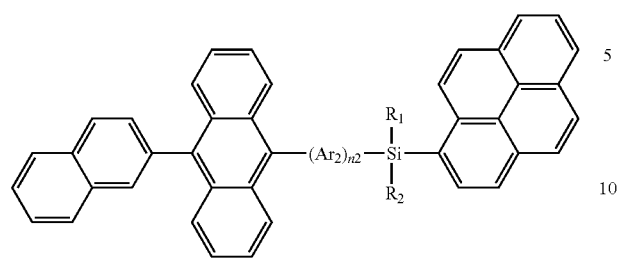

In Formulae 1c to 1h, $Ar_2$ may be selected from i) a phenylene group, a naphthylene group, and an anthracenylene group, and ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group; n2 may be an integer of 1 or 2; and $R_1$ and $R_2$ may be each independently selected from i) a methyl group, an ethyl group, and an n-propyl group, ii) a methyl group, an ethyl group, and an n-propyl group, each substituted with at least one selected from a deuterium atom, a halogen atom, a cyano group, and a nitro group, iii) a phenyl group, a naphthyl group, and an anthryl group, and iv) a phenyl group, a naphthyl group, and an anthryl group, each substituted with at least one selected from a deuterium atom, a halogen atom, a cyano group, a nitro group, a methyl group, an ethyl group, and an n-propyl group.

The anthracene-based compound of Formula 1 may be a compound represented by one of Formulae 1c to 1h, for example:

<Formula 1c>

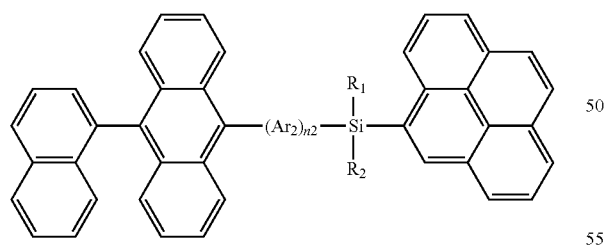

<Formula 1d>

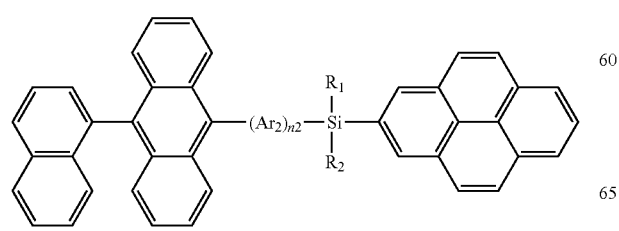

<Formula 1e>

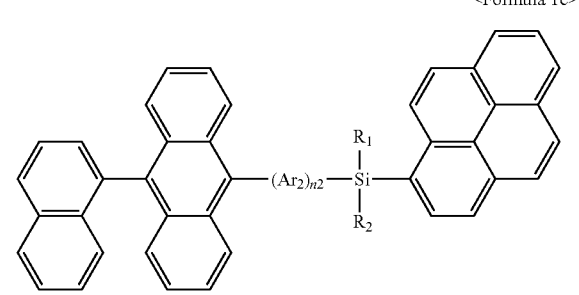

<Formula 1f>

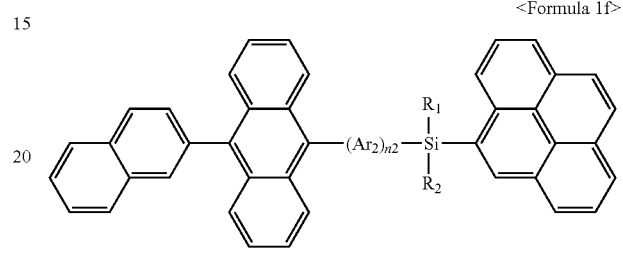

<Formula 1g>

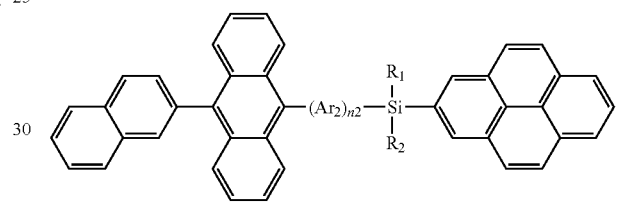

<Formula 1h>

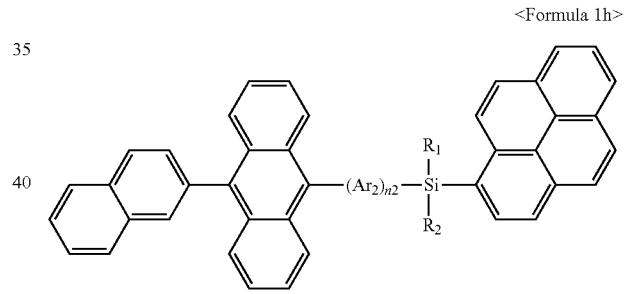

In Formulae 1c to 1h, $(Ar_2)_{n2}$ may be a group represented by one selected from Formulae 3-1 to 3-11:

3-1

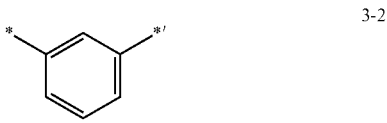

3-2

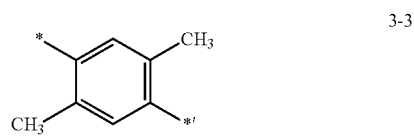

3-3

-continued 3-4
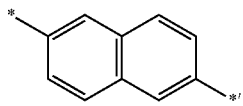

3-5
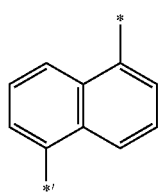

3-6
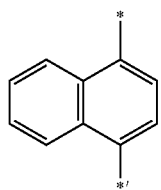

3-7
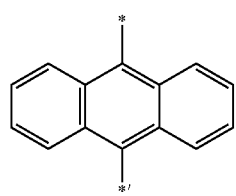

-continued 3-8
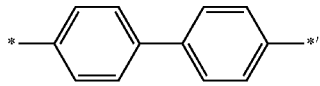

3-9
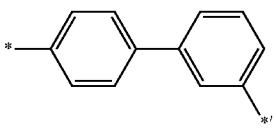

3-10
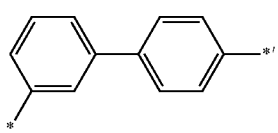

3-11
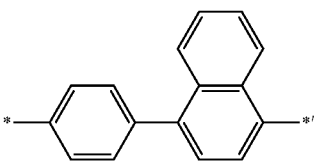

In Formulae 3-1 to 3-11, * indicates a binding site to an anthracene ring, and *' indicates a binding site to a Si atom; and R₁ and R₂ may be each independently selected from a methyl group, an ethyl group, a phenyl group, and a 2-naphthyl group. The anthracene-based compound of Formula 1 may be a compound selected from Compounds 1 to 32, for example:

<Compound 1>
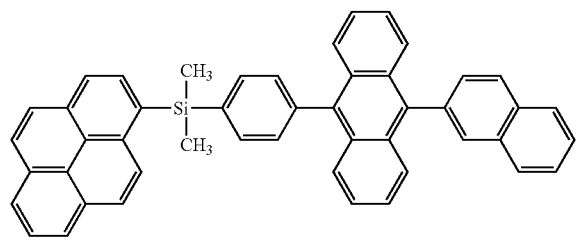

<Compound 2>
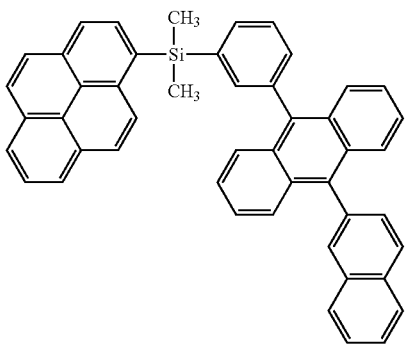

<Compound 3>
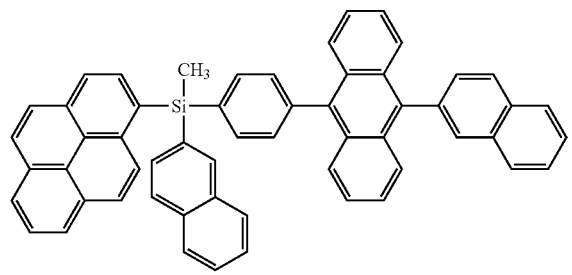

<Compound 4>
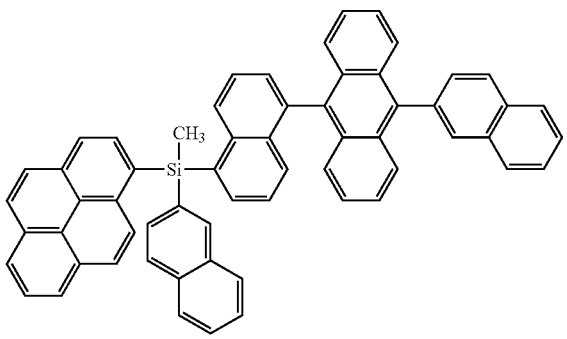

-continued
<Compound 5>
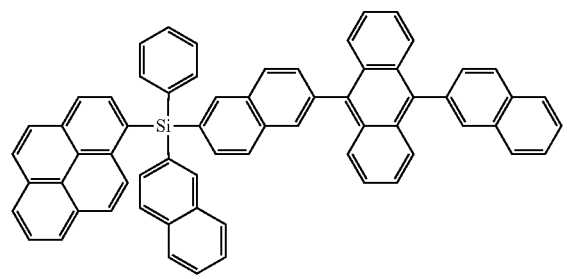
<Compound 6>
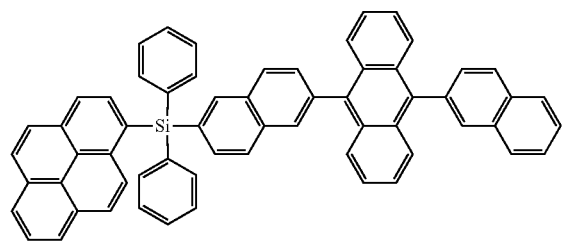
<Compound 7>
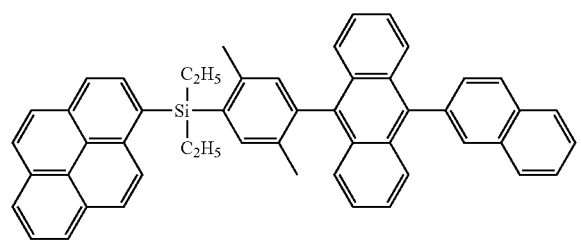
<Compound 8>
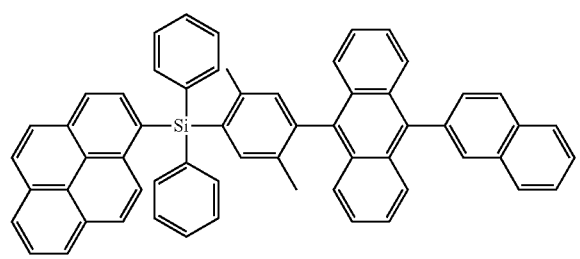
<Compound 9>
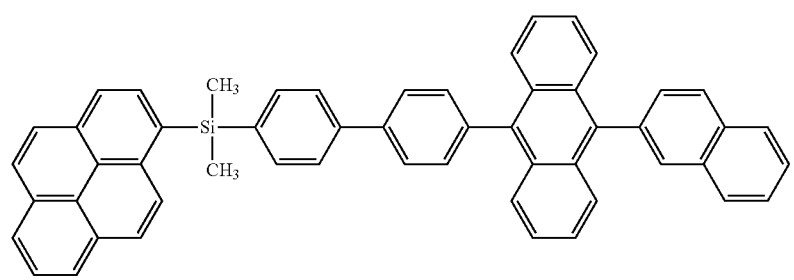
<Compound 10>
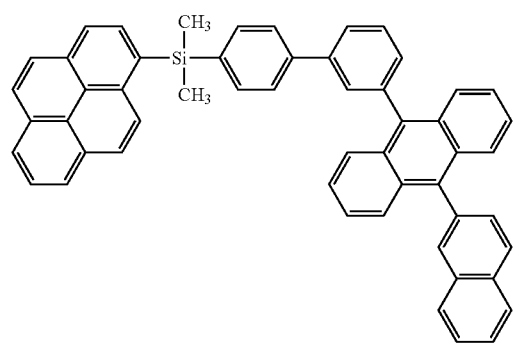
<Compound 11>
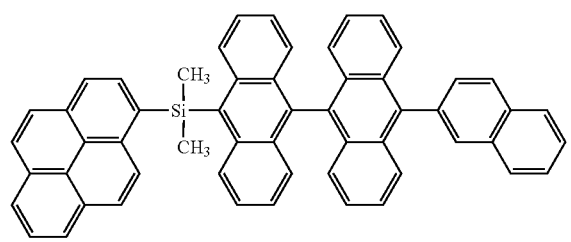
<Compound 12>
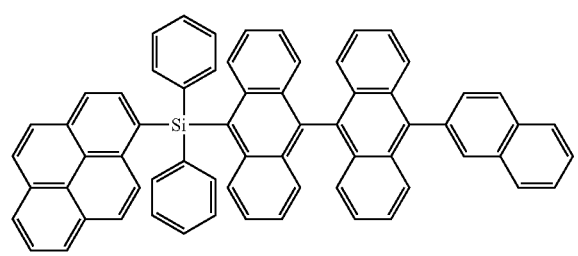
<Compound 13>
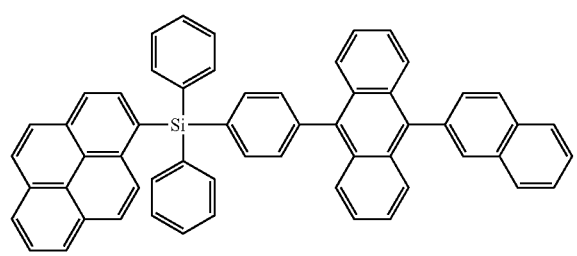

<Compound 14>
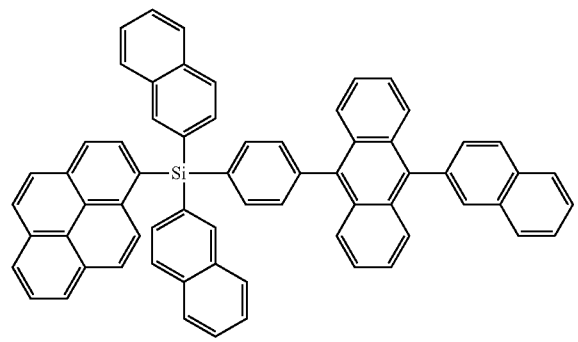
<Compound 15>
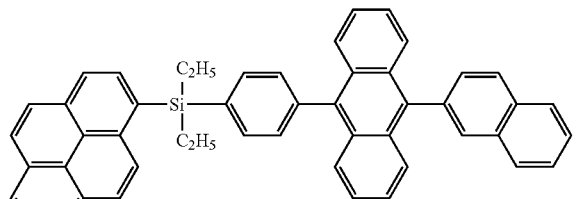
<Compound 16>
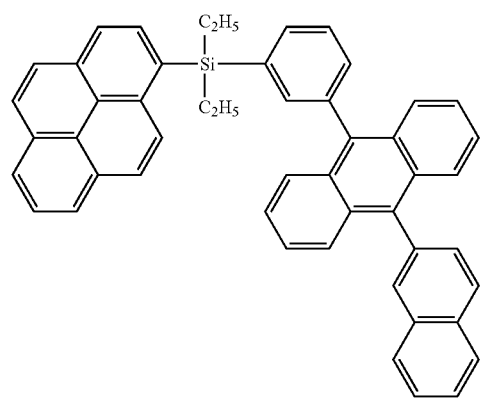
<Compound 17>
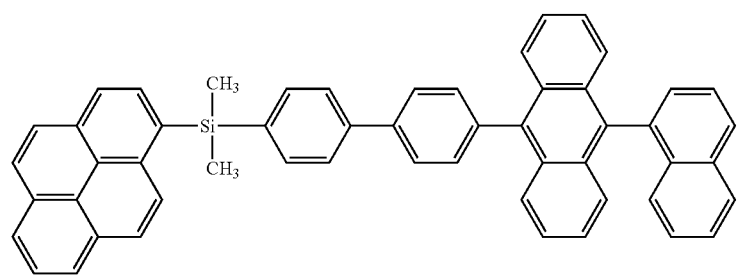
<Compound 18>
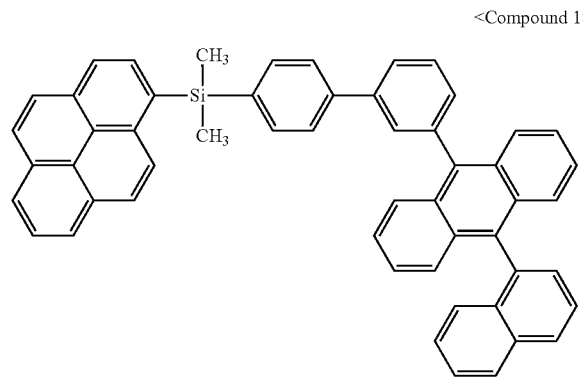
<Compound 19>
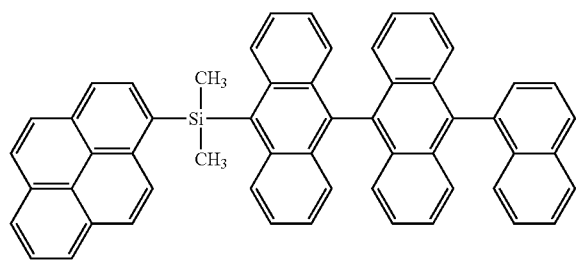

-continued
<Compound 20>
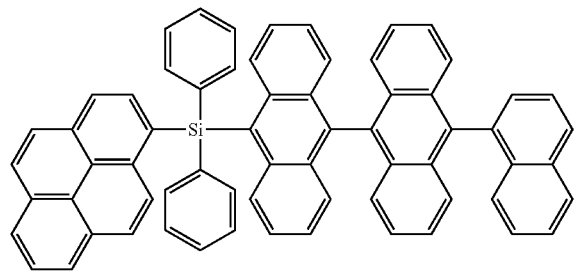
<Compound 21>
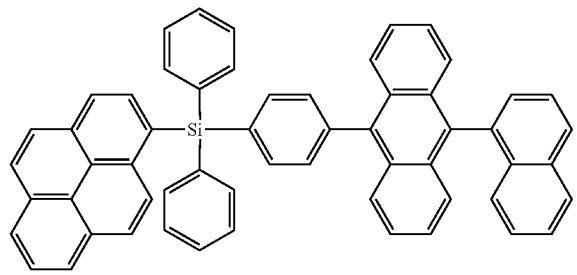
<Compound 22>
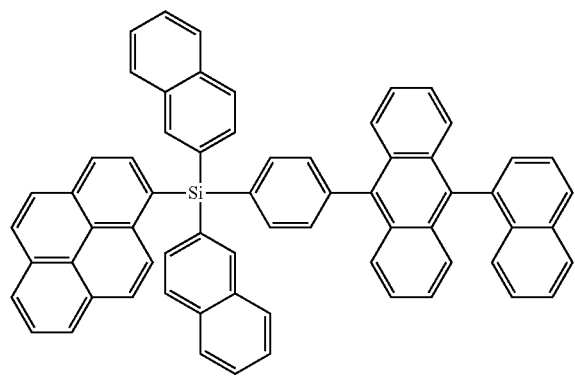
<Compound 23>
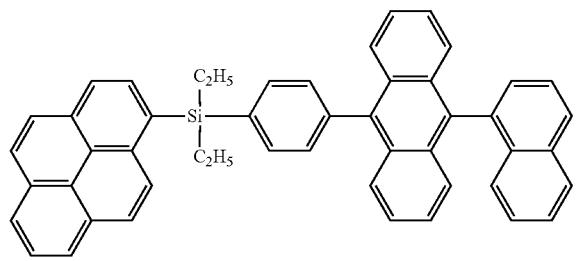
<Compound 24>
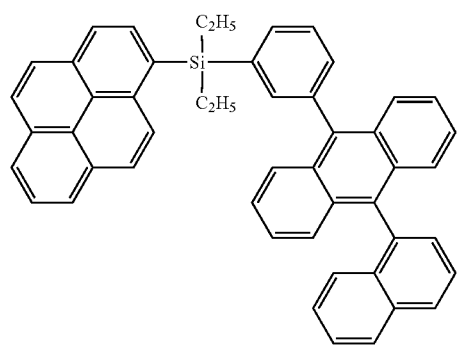
<Compound 25>
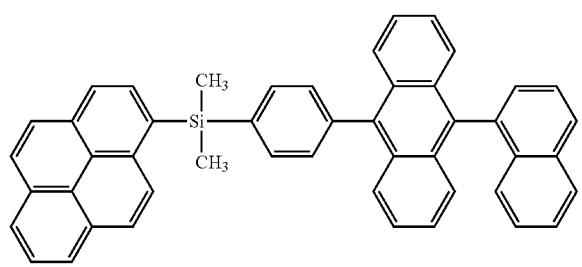
<Compound 26>
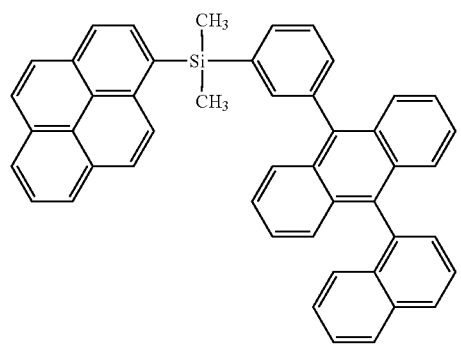
<Compound 27>
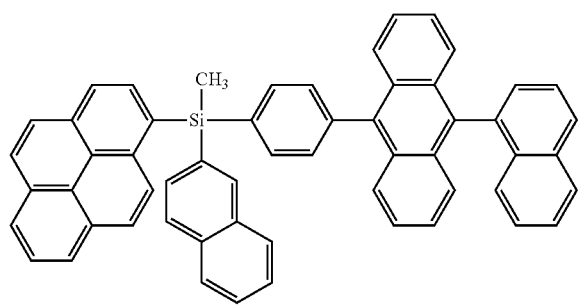

-continued

<Compound 28>

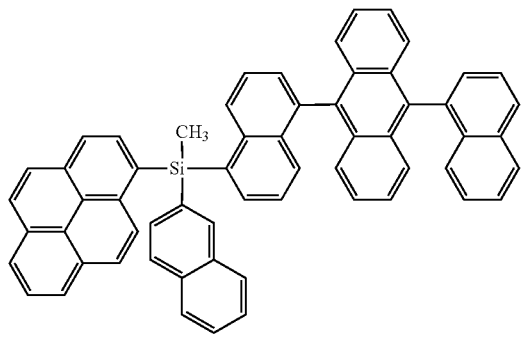

<Compound 29>

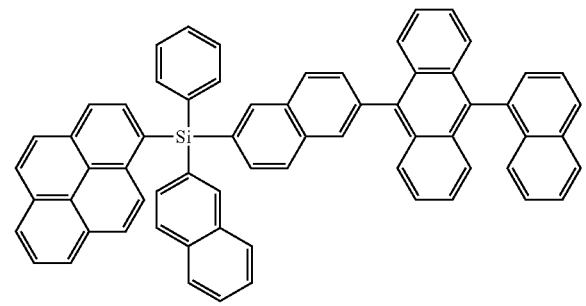

<Compound 30>

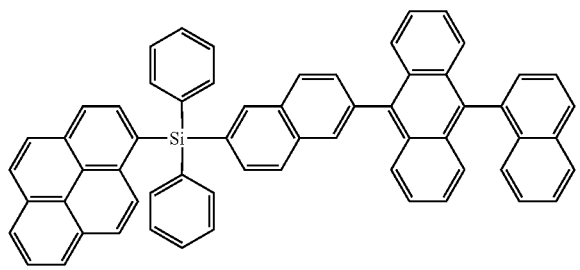

<Compound 31>

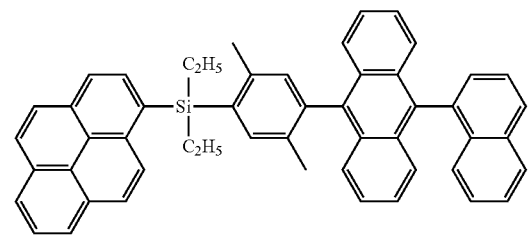

<Compound 32>

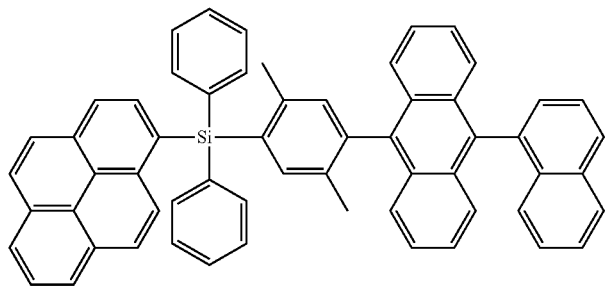

In an embodiment, the anthracene-based compound of Formula 1 may have the anthracene ring (e.g., linked with silicon) substituted asymmetrically. A maximum photoluminescence (PL) peak wavelength of the anthracene-based compound of Formula 1 may be easily controlled by using different types of substituents. The thermal stability, optical characteristics, and chemical characteristics of the anthracene-based compound of Formula 1 may also be controlled by introducing an appropriate type of substituent. An organic light-emitting device including the anthracene-based compound of Formula 1 may have a high emission efficiency and may emit blue light.

In the anthracene-based compound of Formula 1, a conjugation through an anthracene ring to a pyrene ring might be formed due to a Si atom. An electron distribution of the anthracene ring may be less affected by the introduction of the pyrene ring, and the pyrene ring may independently serve as an emission host. When an aromatic condensed ring having 10 or more carbon atoms is introduced to a Si atom, for example, the aromatic condensed ring may serve as an emission host. As compared to a compound substituted with an aromatic ring including a relatively low number of carbons, the anthracene-based compound of Formula 1, which includes an aromatic condensed ring having a large number of carbons, such as a pyrene ring, introduced to a Si atom, for example, may be more suitable for use an emission host. The anthracene-based compound of Formula 1 may be synthesized using organic synthesis. A synthesis method of the anthracene-based compound of Formula 1 may be understood by those of ordinary skill in the art with reference to the examples described herein.

At least one anthracene-based compound of Formula 1 may be used between a pair of electrodes in an organic light-emitting device. At least one anthracene-based compound of Formula 1 may be used in an emission layer. For example, at least one anthracene-based compound of Formula 1 may be used as a host in the emission layer.

An organic light-emitting device is provided that may include a first electrode, a second electrode opposite to the first electrode, and an organic layer between the first and second electrodes, wherein the organic layer includes at least one anthracene-based compound of Formula 1 described herein. As used herein, "(for example, the organic layer) including at least one anthracene-based compound means that "(the organic layer) including one of the anthracene-based compounds of Formula 1, or at least two different anthracene-based compounds of Formula 1."

The organic layer may, for example, include only Compound 1 as the anthracene-based compound. Compound 1 may be present, for example, in the hole transport layer of the organic light-emitting device. For example, the organic layer may include Compounds 1 and 2 as the anthracene-based compound. Compound 1 and Compound 2 may be in the same layer, for example, in the emission layer, or in first and second emission layers of the organic light-emitting device. The organic layer may include a hole transport region between the first electrode and the emission layer, and an electron transport region between the emission layer and the second electrode, the hole transport region including at least one of a hole injection layer, a hole transport layer, a functional layer (hereinafter, an "H-functional layer") having both hole injection and hole transport capabilities, a buffer layer, and an electron blocking layer; the electron transport region including at least one of a hole blocking layer, an electron transport layer, and an electron injection layer.

For example, the anthracene-based compound of Formula 1 may be present in the emission layer. Other compounds may be present additionally or alternatively. For example, the emission layer may further include a dopant. The anthracene-based compound of Formula 1 may serve as a host. Other compounds may serve as host additionally or alternatively. The term "organic layer" as used herein refers to a single layer and/or a plurality of layers between the first and second electrodes of the organic light-emitting device.

Figure 1:
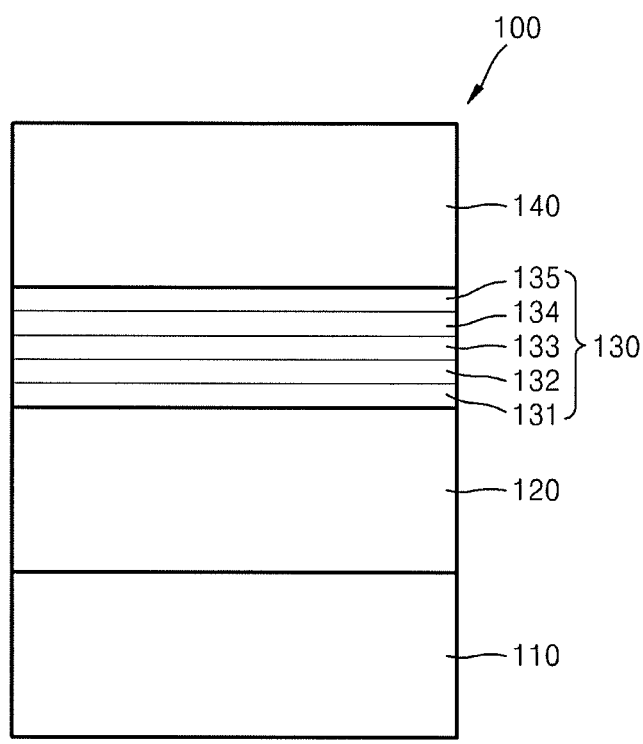
FIG. 1 illustrates a schematic view of a structure of an organic light-emitting device.

FIG. 1 illustrates a schematic sectional view of an organic light-emitting device 100. A structure of an organic light-emitting device and a method of manufacturing the same are described with reference to FIG. 1. Referring to FIG. 1, the organic light-emitting device 100 according to the present embodiment may include a substrate 110, a first electrode 120, an organic layer 130, and a second electrode 140. The substrate 110 may be any suitable substrate for use in organic light-emitting devices. For example, the substrate 11 may be a glass substrate or a transparent plastic substrate with strong mechanical strength, thermal stability, transparency, surface smoothness, ease of handling, and water resistance.

The first electrode 120 may be formed by depositing or sputtering a first electrode-forming material on the substrate 110. When the first electrode 120 constitutes an anode, for example, a material having a high work function may be used as the first electrode-forming material to facilitate hole injection. The first electrode 120 may be a reflective electrode or a transmission electrode. Transparent and conductive materials such as ITO, IZO, $SnO_2$, and ZnO may be used, for example, to form the first electrode 120. The first electrode 120 may be formed as a reflective electrode using, for example, magnesium (Mg), aluminum (Al), aluminum-lithium (Al—Li), calcium (Ca), magnesium-indium (Mg—In), magnesium-silver (Mg—Ag), or the like. The first electrode 120 may have a single-layer structure or a multi-layer structure including at least two layers. For example, the first electrode 120 may have a three-layered structure of ITO/Ag/ITO. The first electrode may have different number of layers and/or include different layer materials.

The organic layer 130 may be on the first electrode 120. The organic layer 130 may include, for example, a hole injection layer (HIL) 131, a hole transport layer (HTL) 132, a functional layer, also referred to as an H-functional layer) having both hole injection and transport capabilities, a buffer layer, an emission layer (EML) 133, an electron transport layer (ETL) 134, and an electron injection layer (EIL) 135. The HIL 131 may be formed on the first electrode 120 by any of a variety of methods, for example, including vacuum deposition, spin coating, casting, Langmuir-Blodgett (LB) deposition, or the like.

When the HIL 131 is formed using vacuum deposition, for example, vacuum deposition conditions may vary depending on the compound that is used to form the HIL 131, and the desired structure and thermal properties of the HIL 131 to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. Other deposition conditions may be used.

When the HIL 131 is formed using spin coating, for example, the coating conditions may vary depending on the compound that is used to form the HIL 131, and the desired structure and thermal properties of the HIL 131 to be formed. For example, the coating rate may be in the range of about 2000 rpm to about 5000 rpm, and a temperature at which heat treatment is performed to remove a solvent after coating may be in the range of about 80° C. to about 200° C. Other coating conditions may be used.

A material for forming the HIL 131 may be a suitable hole injection material. Examples of the suitable hole injection material may include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(N,N-diphenylamino)triphenylamine (TDATA), 4,4',4"-tris[2-naphthyl(phenyl)amino]triphenylamine (2-TNATA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), and polyaniline)/poly(4-styrenesulfonate (PANI/PSS).

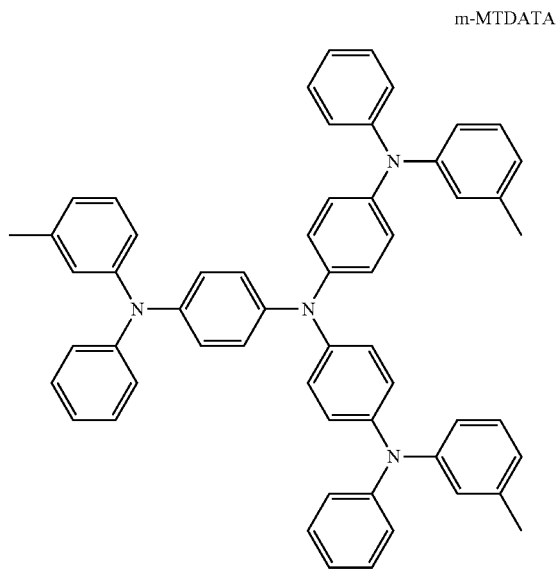

m-MTDATA

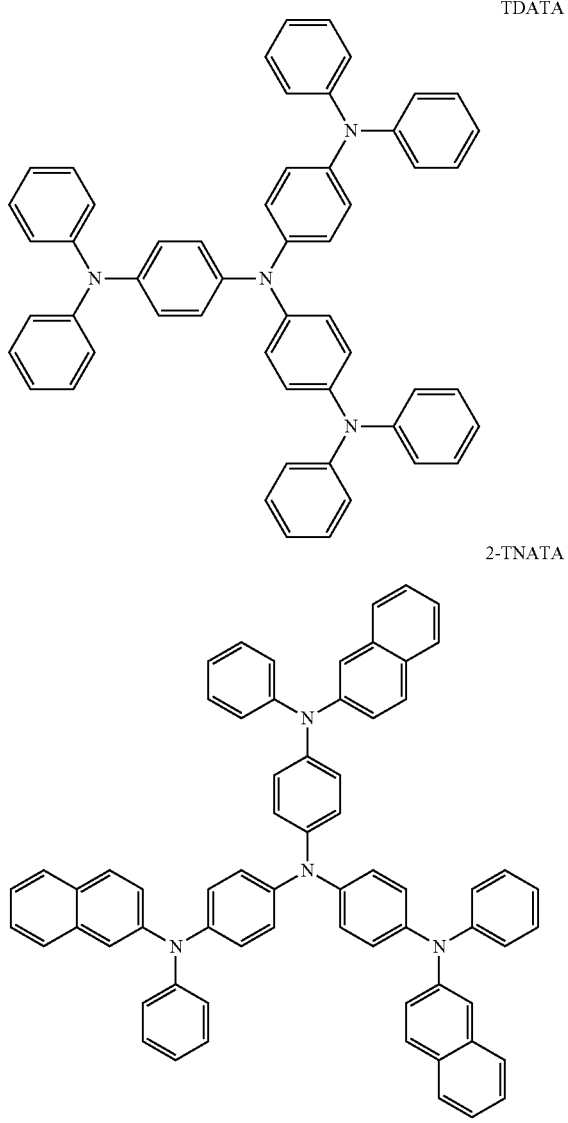

TDATA

2-TNATA

The thickness of the HIL 131 may be about 100 Å to about 10000 Å, or, for example, may be from about 100 Å to about 1000 Å. When the thickness of the HIL 131 is within these ranges, for example, the HIL 131 may have a good hole injecting ability without a substantial increase in driving voltage.

Then, the HTL 132 may be formed on the HIL 131 by using any of a variety of methods, for example, vacuum deposition, spin coating, casting, LB deposition, or the like. When the HTL 132 is formed using vacuum deposition or spin coating, for example, the conditions for deposition and coating may be similar to those for the formation of the HIL 131, though the conditions for the deposition and coating may vary depending on the material that is used to form the HTL 132.

Examples of suitable hole transport materials may include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine) (NPB).

TPD

NPB

The thickness of the HTL 132 may be from about 50 Å to about 2000 Å, or, for example, may be from about 100 Å to about 1500 Å. When the thickness of the HTL 132 is within these ranges, for example, the HTL 132 may have a good hole transporting ability without a substantial increase in driving voltage.

The H-functional layer (having both hole injection and hole transport capabilities) may contain at least one material from each group of the hole injection layer materials and hole transport layer materials. The thickness of the H-functional layer may be from about 500 Å to about 10,000 Å, or, for example, may be from about 100 Å to about 1,000 Å. When the thickness of the H-functional layer is within these ranges, for example, the H-functional layer may have good hole injection and transport capabilities without a substantial increase in driving voltage.

At least one of the HIL 131, the HTL 132, and the H-functional layer may include, for example at least one of a compound of Formula 300 and a compound of Formula 350:

<Formula 300>

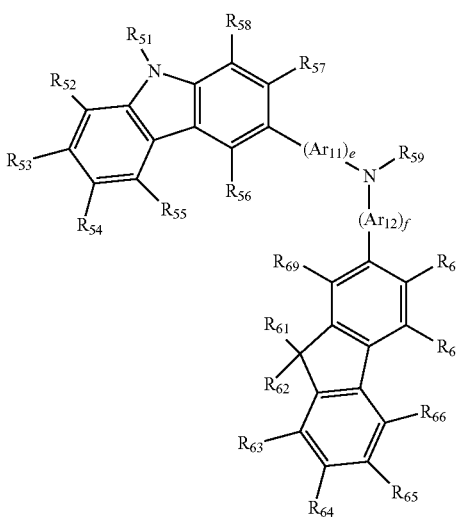

<Formula 350>

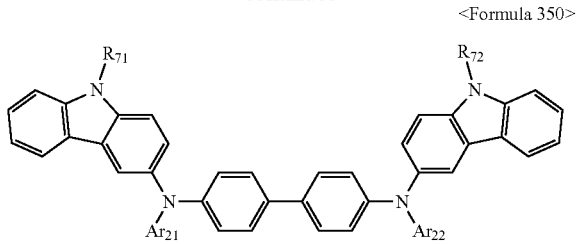

In Formula 300, $Ar_{11}$ and $Ar_{12}$ may be each independently selected from a substituted or unsubstituted $C_3$-$C_{30}$ cycloalkylene group, a substituted or unsubstituted $C_3$-$C_{30}$ cycloalkenylene group, a substituted or unsubstituted $C_6$-$C_{30}$ arylene group, a substituted or unsubstituted $C_1$-$C_{30}$ heterocycloalkylene group, a substituted or unsubstituted $C_1$-$C_{30}$ heterocycloalkenylene group, and a substituted or unsubstituted $C_1$-$C_{30}$ heteroarylene group. A detailed description of $Ar_{11}$ and $Ar_{12}$ may be the same as described herein in conjunction with $Ar_1$.

In Formula 350, $Ar_{21}$ and $Ar_{22}$ may be each independently a substituted or unsubstituted aryl group. For example, a detailed description of $Ar_{21}$ and $Ar_{22}$ may be the same as described herein in conjunction with $R_1$. For example, $Ar_{21}$ and $Ar_{22}$ in Formula 350 may be each independently selected from a phenyl group, a naphthyl group, an anthryl group, and a biphenyl group; and a phenyl group, a naphthyl group, an anthryl group, and a biphenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_1$-$C_{30}$ alkoxy group, and the like.

In Formula 300, e and f may be each independently an integer from 0 to 5, for example, may be 0, 1, or 2. For example, e may be 1, and f may be 0. Other integers may be used for e and/or f. In Formulae 300 and 350, $R_{51}$ to $R_{58}$, $R_{61}$ to $R_{69}$, $R_{71}$, and $R_{72}$ may be each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, or a substituted or unsubstituted $C_6$-$C_{30}$ arylthio group. For example, $R_{51}$ to $R_{58}$, $R_{61}$ to $R_{69}$, $R_{71}$, and $R_{72}$ in Formulae 300 and 350 may be each independently selected, for example, from a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group (for example, a methyl group, an ethyl group, a propyl group, a butyl group, a pentyl group, a hexyl group, and the like), and a $C_1$-$C_{30}$ alkoxy group (for example, a methoxy group, an ethoxy group, a propoxy group, a butoxy group, a pentoxy group, and the like); a $C_1$-$C_{30}$ alkyl group and a $C_1$-$C_{30}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, and a pyrenyl group; and a phenyl group, a naphthyl group, an anthryl group, a fluorenyl group, and a pyrenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, and a $C_1$-$C_{30}$ alkoxy group.

In Formula 300, $R_{59}$ may be one selected from a phenyl group, a naphthyl group, an anthryl group, a biphenyl group, and a pyridyl group; and a phenyl group, a naphthyl group, an anthryl group, a biphenyl group, and a pyridyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{30}$ alkyl group, and a substituted or unsubstituted $C_1$-$C_{30}$ alkoxy group.

The compound of Formula 300 may be a compound represented by Formula 300A, for example:

<Formula 300A>

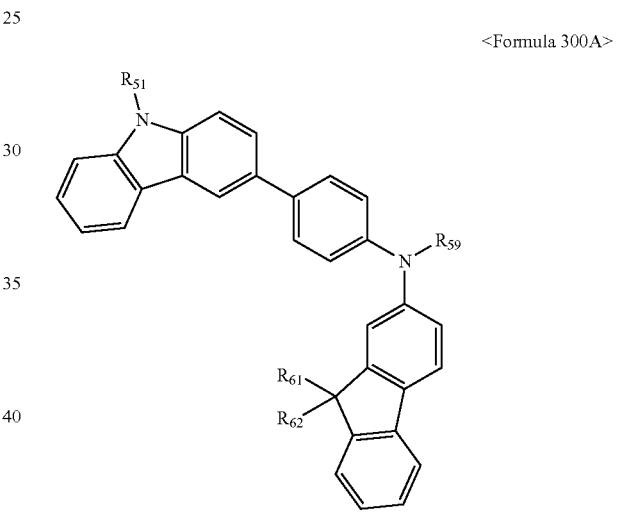

In Formula 300A, a detailed description of $R_{51}$, $R_{61}$, $R_{62}$, and $R_{59}$ may be the same as the ones for Formula 300 described herein.

At least one of the HIL 131, the HTL 132, and the H-functional layer may include at least one of the compounds represented by Formulae 301 to 320:

301

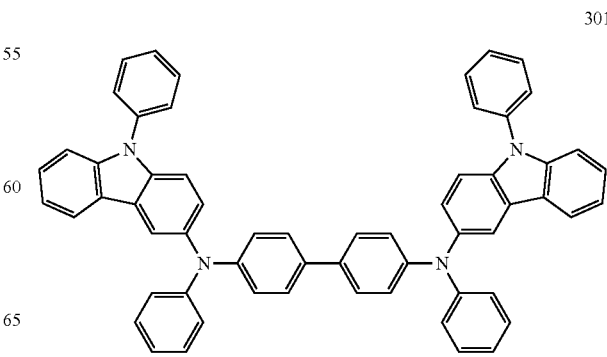

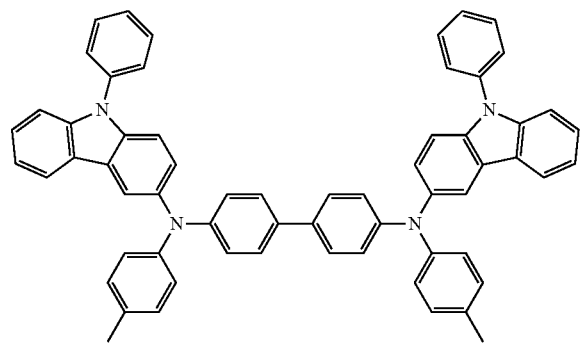
302
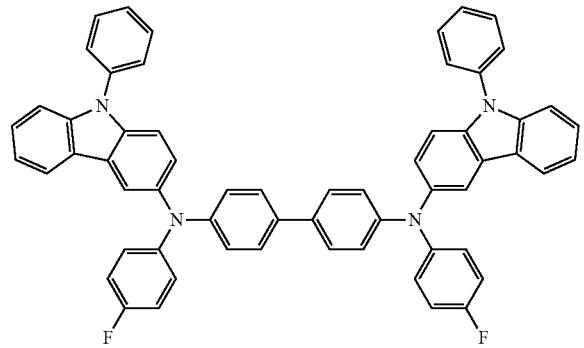
303
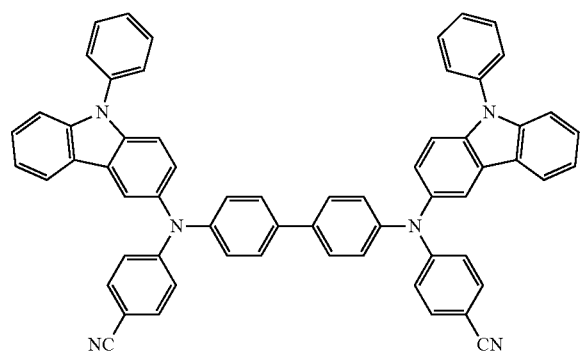
304
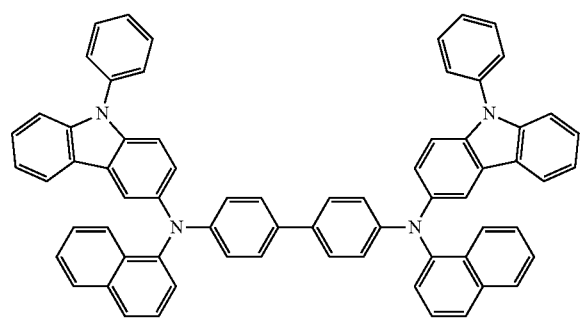
305
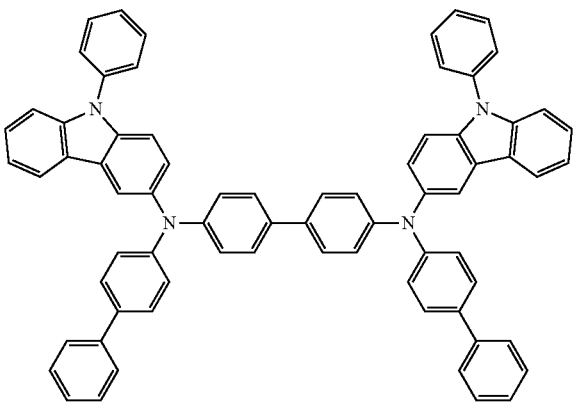
306
307
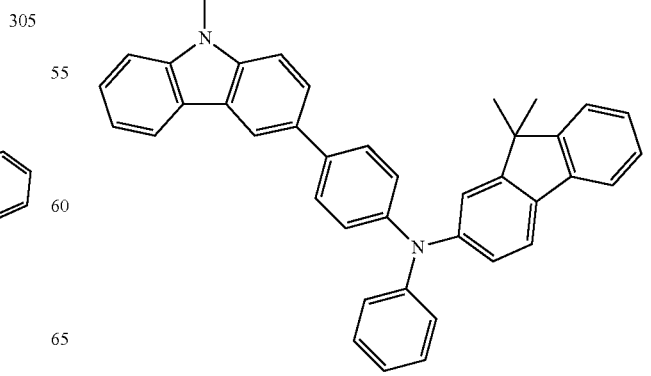
308
309

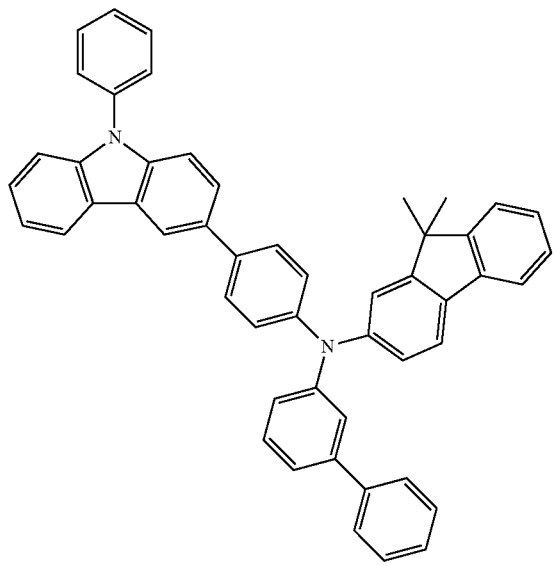
310
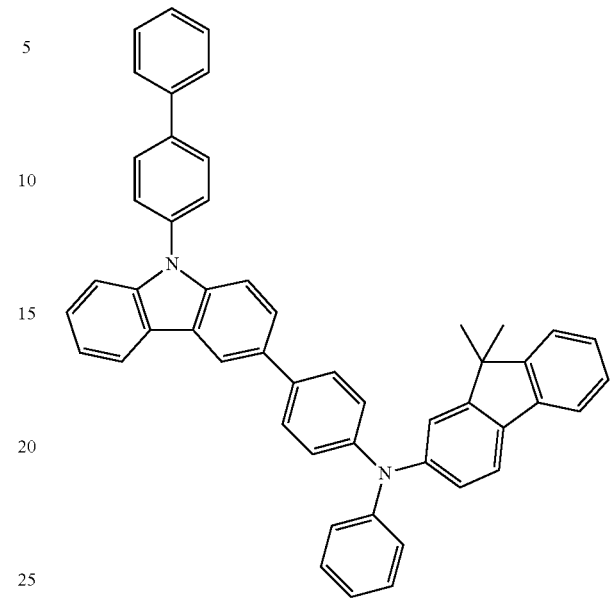
312
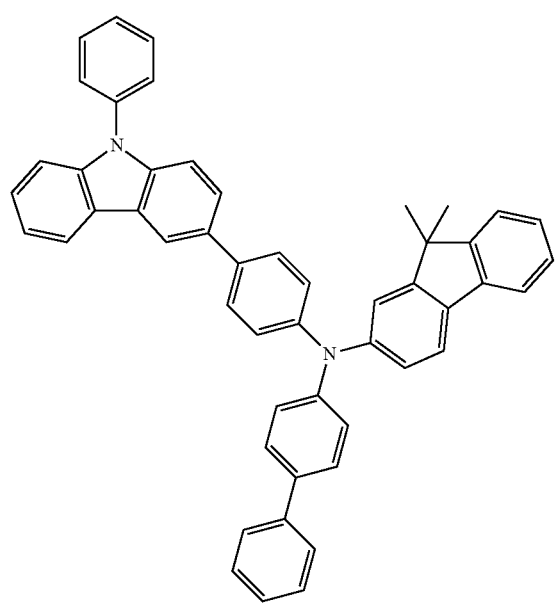
311
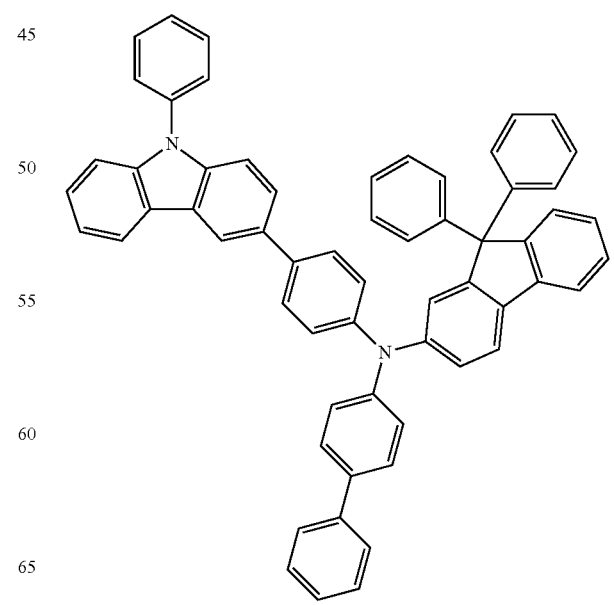
313

314
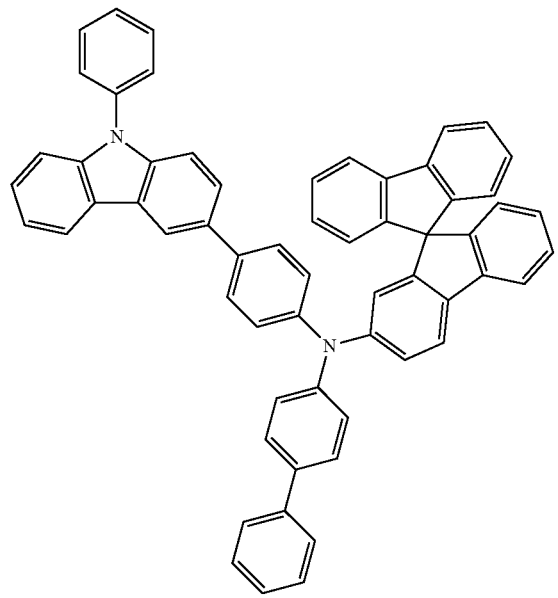
315
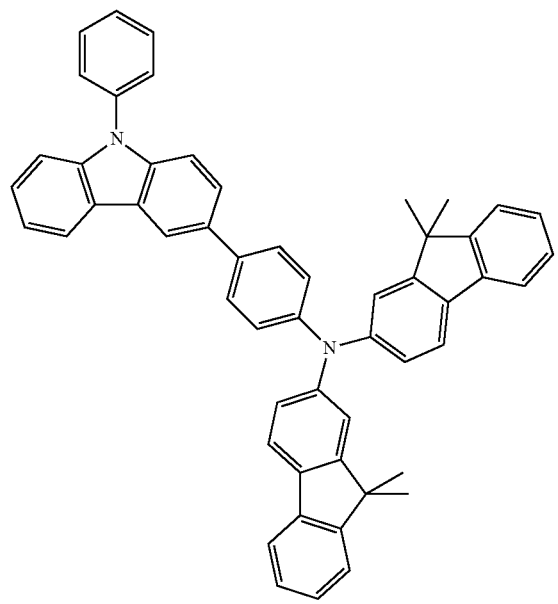
316
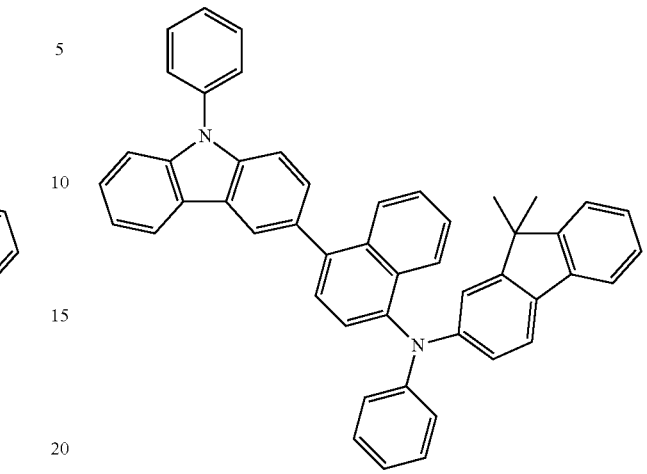
317
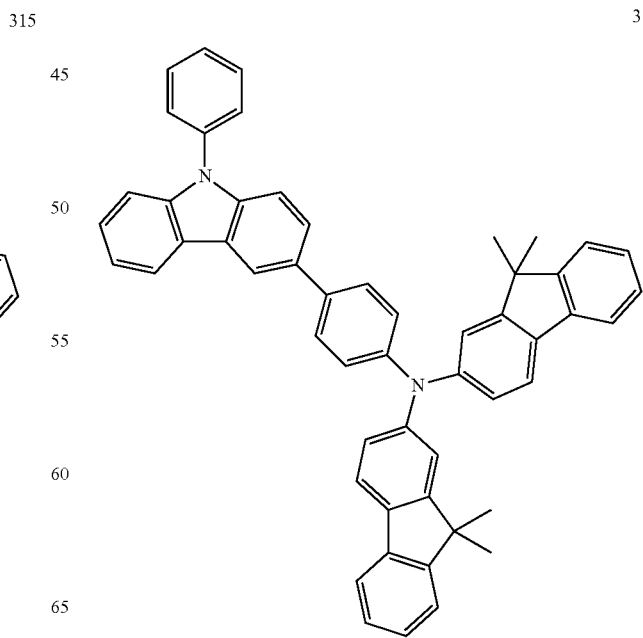

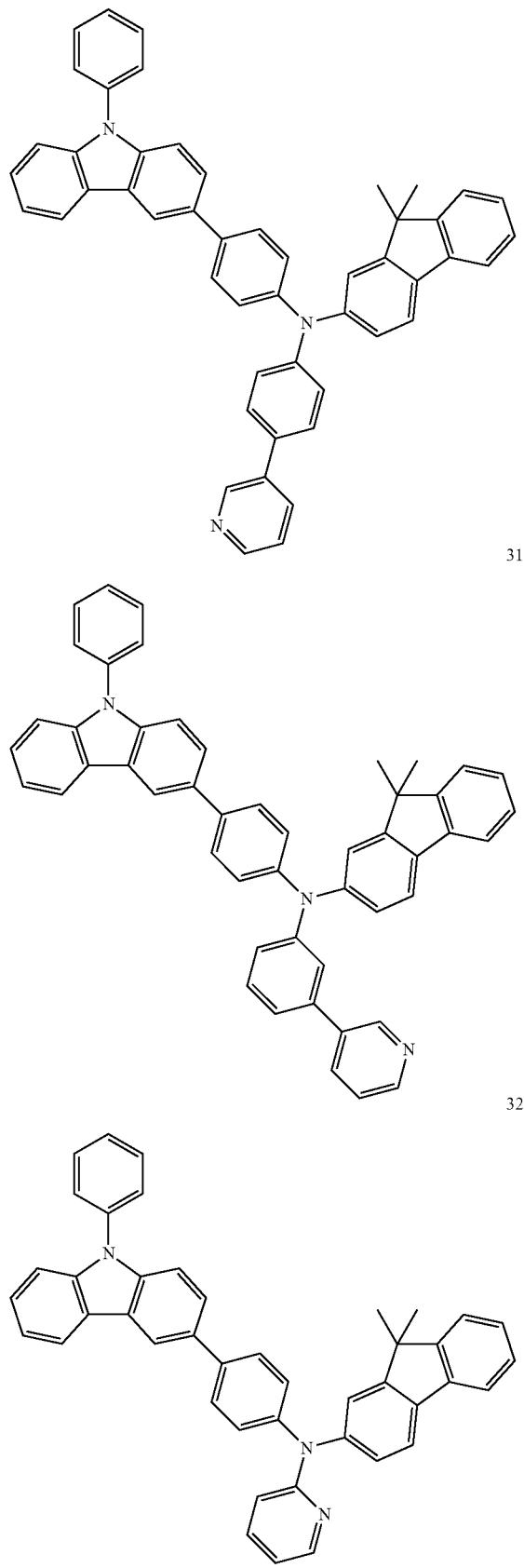

318

319

320

At least one of the HIL 131, the HTL 132, and the H-functional layer may further include a charge-generating material to have improved conductivity, in addition to a suitable hole injecting material, hole transport material, and/or material having both hole injection and hole transport capabilities as described herein.

The charge-generating material may be one of quinine derivatives, metal oxides, and compounds with a cyano group, for example. Examples of the p-dopant include quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200.

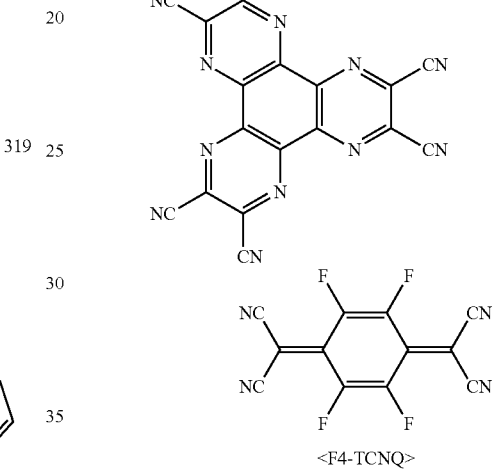

<Compound 200>

<F4-TCNQ>

When the HIL 131, the HTL 132, or the H-functional layer further includes a charge-generating material, for example, the charge-generating material may be homogeneously dispersed or inhomogeneously distributed in the layer. The buffer layer may be between at least one of the HIL 131, the HTL 132, and the H-functional layer, and the EML 133. The buffer layer may compensate for an optical resonance distance of light according to a wavelength of the light emitted from the EML 133, and thus may increase efficiency. The buffer layer may include any suitable hole injecting material or hole transporting material. The buffer layer may include the same material as one of the materials included in the HIL 131, the HTL 132, and the H-functional layer that underlie the buffer layer.

Then, the EML 133 may be formed on the HTL 132, the H-functional layer, or the buffer layer by vacuum deposition, spin coating, casting, LB deposition, or the like. When the EML 133 is formed using vacuum deposition or spin coating, for example, the deposition and coating conditions may be similar to those for the formation of the HIL 131, though the conditions for deposition and coating may vary depending on the material that is used to form the EML 133.

The EML 133 may include a suitable light-emitting material. For example, the EML 133 may include the anthracene-based compound of Formula 1. The EML 133 may include a suitable host and a suitable dopant. Examples of a suitable host may include aluminum tris(8-hydroxyquinoline) (Alq3), 4,4'-N,N'-dicarbazole-biphenyl (CBP), poly (n-vinylcarbazole (PVK), 9,10-di(naphthalene-2-yl)anthracene (AND), 4,4',4''-tris(carbazole-9-yl)triphenylamine (TCTA), 1,3,5-tris(N-phenylbenzimidazole-2-yl)benzene)

(TPBI), 3-tert-butyl-9,10-di(naphth-2-yl)anthracene (TBADN), 9,9'-(1,3-phenylene)bis-9H-carbazole (mCP), and 1,3-bis[2-(4-tert-butylphenyl)-1,3,4-oxadiazo-5-yl] (OXD-7).

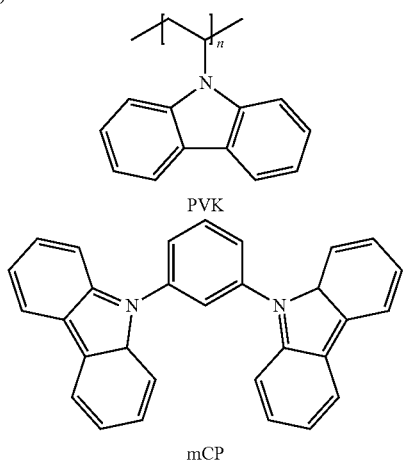

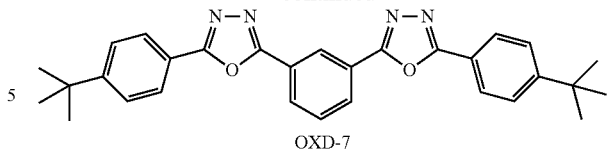

For example, at least one of a fluorescent dopant and a phosphorescent dopant may be used. For example, the phosphorescent dopant may be an organometallic complex including at least one selected from among iridium (Ir), platinum (Pt), osmium (Os), rhenium (Re), titanium (Ti), zirconium (Zr), hafnium (Hf), a combination of at least two thereof, and the like.

Examples of suitable blue dopants include $F_2Irpic$, $(F_2ppy)_2Ir(tmd)$, $Ir(dfppz)_3$, ter-fluorene, 4,4'-bis(4-diphenylaminostyryl)biphenyl (DPAVBi), 2,5,8,11-tetra-tert-butyl perylene (TBPe), and 4,4'-bis(2,2,-diphenylvinyl)-1,1'-biphenyl (DPVBi).

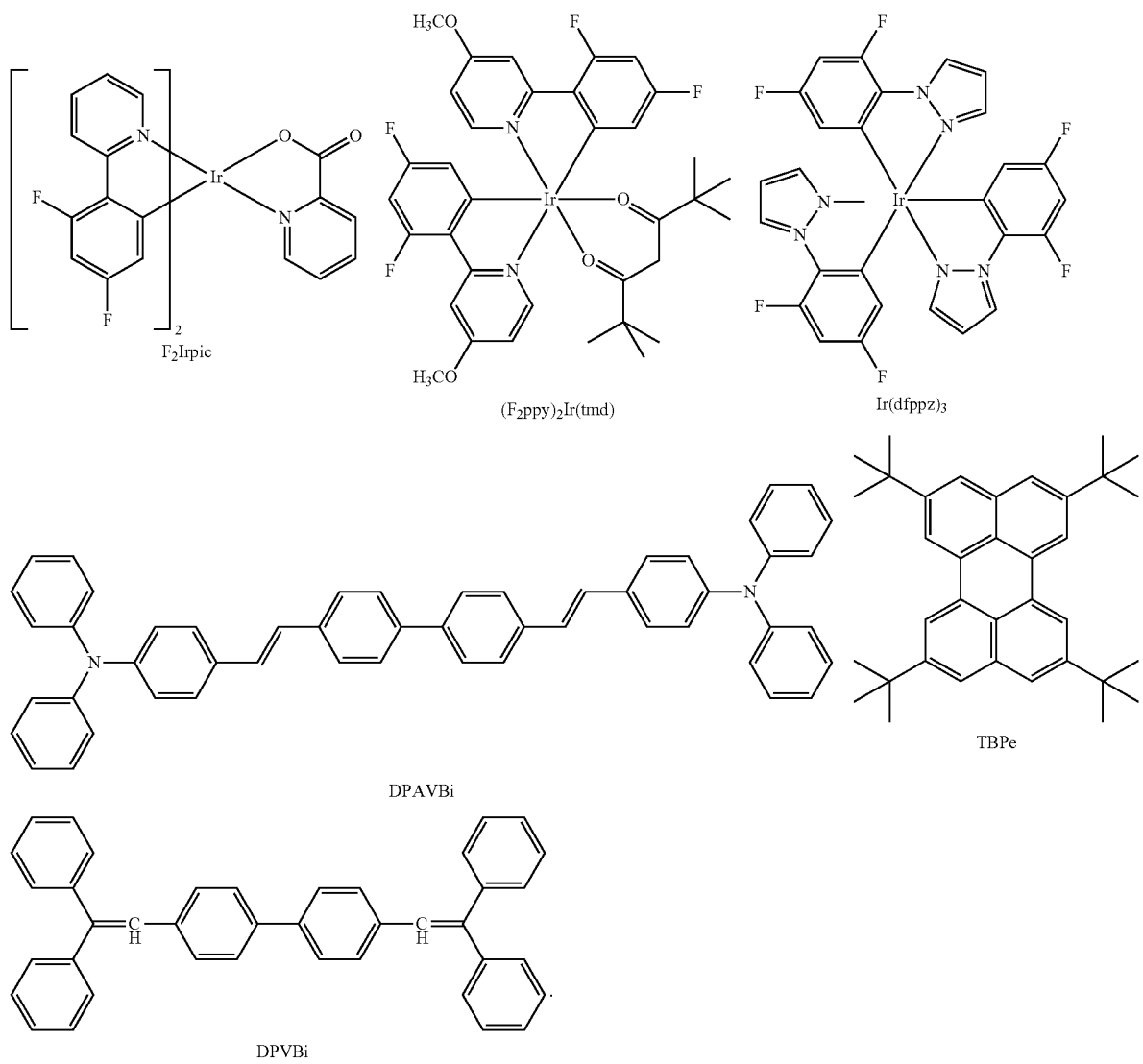

Examples of red dopants include PtOEP, Ir(piq)₃, and BtpIr.

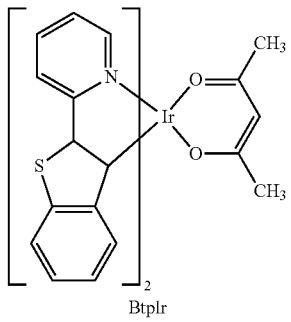

BtpIr

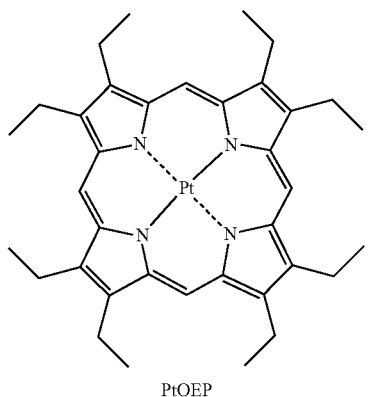

PtOEP

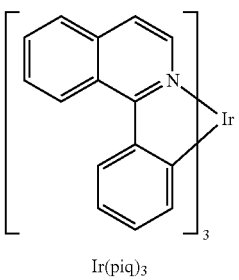

Ir(piq)₃

Examples of green dopants include Ir(ppy)₃ (ppy=phenylpyridine), Ir(ppy)₂(acac), and Ir(mpyp)₃.

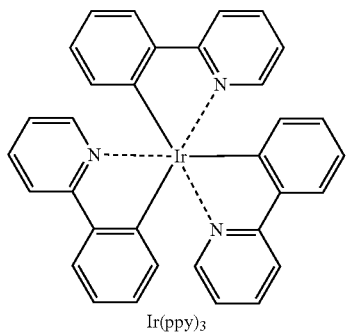

Ir(ppy)₃

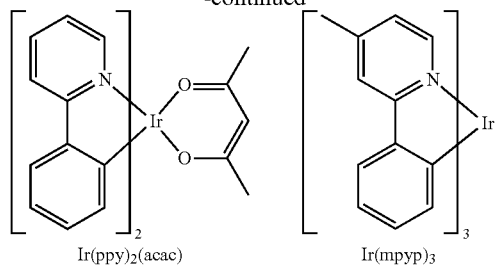

Ir(ppy)₂(acac)    Ir(mpyp)₃

For example, a suitable dopant may be a dopant represented by Formula 100, for example:

<Formula 100>

In Formula 100, X may be selected from a substituted or unsubstituted $C_3$-$C_{30}$ cycloalkyl group, a substituted or unsubstituted $C_3$-$C_{30}$ cycloalkenyl group, and a substituted or unsubstituted $C_6$-$C_{30}$ aryl group; $Ar_{101}$ and $Ar_{102}$ may be each independently selected from a substituted or unsubstituted $C_6$-$C_{30}$ aryl group and a substituted or unsubstituted $C_1$-$C_{30}$ heteroaryl group; and n may be an integer from 1 to 4. X in Formula 100 may be selected, for example, from i) a naphthalenyl group, a phenanthrenyl group, a pyrenyl group, an anthracenyl group, a chrysenyl group, a fluorenyl group, and a benzofluorenyl group; and ii) a naphthalenyl group, a phenanthrenyl group, a pyrenyl group, an anthracenyl group, a chrysenyl group, a fluorenyl group, and a benzofluorenyl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group.

X in Formula 100 may be selected, for example, from i) a fluorenyl group and a benzofluorenyl group; and ii) a fluorenyl group and a benzofluorenyl group, each substituted with at least one of a deuterium atom, —F, a cyano group, a nitro group, a methyl group, an ethyl group, a n-propyl group, an iso-propyl group, a n-butyl group, a sec-butyl group, an iso-butyl group, a tert-butyl group, and a phenyl group. X in Formula 100 may be selected, for example, from i) a fluorenyl group and a benzofluorenyl group; and ii) a fluorenyl group and a benzofluorenyl group, each substituted with a phenyl group.

For example, in Formula 100, $Ar_{101}$ and $Ar_{102}$ may be each independently selected, for example, from i) a $C_6$-$C_{30}$ aryl group; and ii) a $C_6$-$C_{30}$ aryl group substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, a $C_1$-$C_{30}$ heteroaryl group, and —Si(Q)(Q$_2$)(Q$_3$), where Q$_1$ to Q$_3$ may be each independently selected from a $C_1$-$C_{30}$ alkyl group and a $C_6$-$C_{30}$ aryl group.

Ar$_{101}$ and Ar$_{102}$ in Formula 100 may be each independently selected, for example, from i) a phenyl group, a naphthyl group, and a biphenyl group; and ii) a phenyl group, a naphthyl group, and a biphenyl group, each substituted with at least one selected from a deuterium atom, —F, a cyano group, a nitro group, a methyl group, an ethyl group, a n-propyl group, an iso-propyl group, a n-butyl group, a sec-butyl group, an iso-butyl group, a tert-butyl group, a phenyl group, and —Si(Q$_1$)(Q$_2$)(Q$_3$), where Q$_1$ to Q$_3$ may be each independently selected from a methyl group, a tert-butyl group, and a phenyl group.

Ar$_{101}$ and Ar$_{102}$ in Formula 100 may be each independently selected, for example, from i) a phenyl group; and ii) a phenyl group substituted with at least one selected from —F, a methyl group, a phenyl group, and —Si(CH$_3$)$_3$. For example, in Formula 100, n may be an integer of 2. Other integers for n may be used. For example, the dopant represented by Formula 100 may be Compound 101:

101

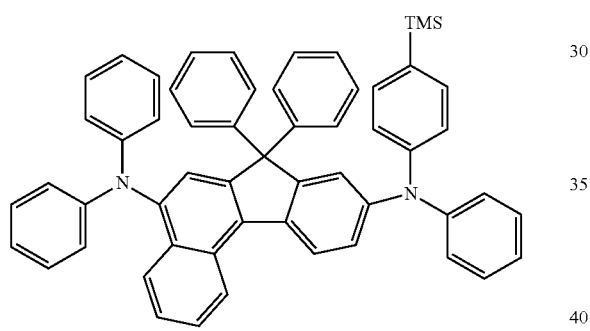

When the EML 133 includes both a host and a dopant, for example, an amount of the dopant may be from about 0.01 wt % to about 15 wt % based on 100 wt % of the EML 133. The amount of the dopant may have other ranges. A thickness of the EML 133 may be about 200 Å to about 700 Å. When the thickness of the EML 133 is within these ranges, for example, the EML 133 may have a good light emitting ability without a substantial increase in driving voltage.

Then, the ETL 134 may be formed on the EML 133 by vacuum deposition, spin coating, casting, or the like. When the ETL 134 is formed using vacuum deposition or spin coating, for example, the deposition and coating conditions may be similar to those for the formation of the HIL 131, though the deposition and coating conditions may vary depending on a compound that is used to form the ETL 134. A material for forming the ETL 134 may be any suitable material that can stably transport electrons injected from an electron injecting electrode (cathode). Examples of materials for forming the ETL 134 include a quinoline derivative, such as tris(8-quinolinolato)aluminum (Alq3), TAZ, BAlq, beryllium bis(benzoquinolin-10-olate) (Bebq$_2$), 9,10-di (naphthalene-2-yl)anthracene (ADN), Compound 201, Compound 202, and Bphen.

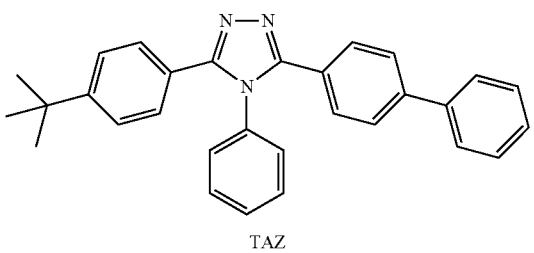

TAZ

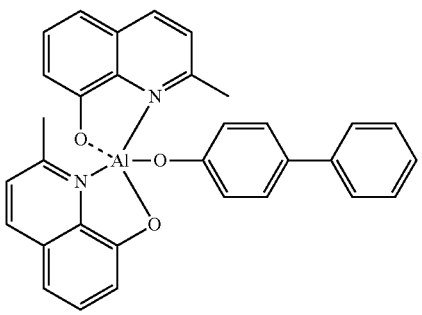

BAlq

<Compound 201>

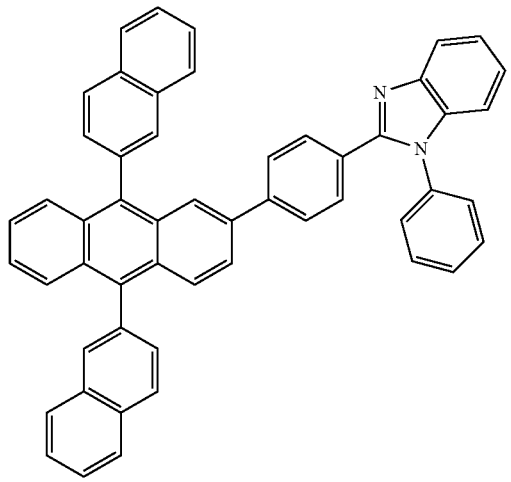

<Compound 202>

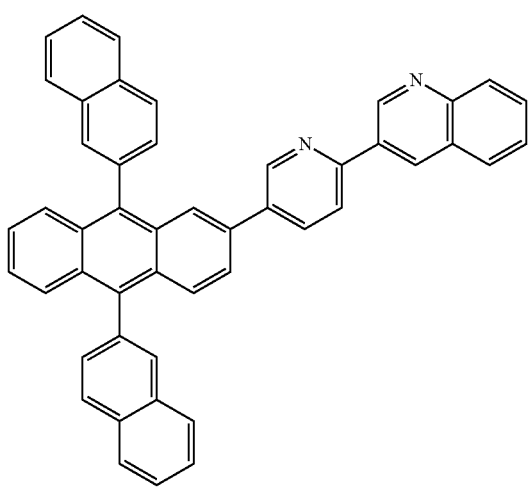

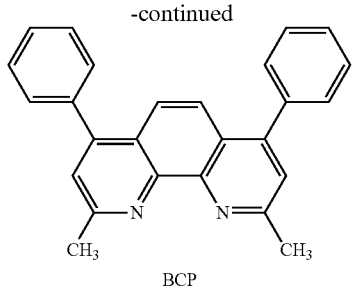

BCP

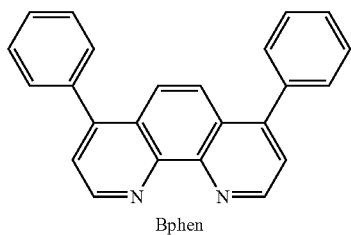

Bphen

The thickness of the ETL 135 may be from about 100 Å to about 1,000 Å, or, for example, may be from about 150 Å to about 500 Å. When the thickness of the ETL 135 is within these ranges, for example, the ETL 135 may have a satisfactory electron transporting ability without a substantial increase in driving voltage. The ETL 135 may further include, for example, a metal-containing material, in addition to any suitable electron-transporting organic compound. The metal-containing material may include a lithium (Li) complex. Examples of the Li complex include lithium quinolate (Liq) and Compound 203:

<Compound 203>

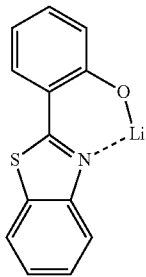

Then, the EIL 135, which facilitates injection of electrons from the cathode, may be formed on the ETL 134. Any suitable electron-injecting material may be used to form the EIL 135. Examples of materials for forming the EIL 135 include LiF, NaCl, CsF, $Li_2O$, BaO, and the like. The deposition and coating conditions for forming the EIL 135 may be similar to those for the formation of the HIL 131, though the deposition and coating conditions may vary depending on the material that is used to form the EIL 135. The thickness of the EIL 135 may be from about 1 Å to about 100 Å, or, for example, may be from about 3 Å to about 90 Å. When the thickness of the EIL 135 is within these ranges, for example, the EIL 135 may have a satisfactory electron injection ability without a substantial increase in driving voltage.

The second electrode 140 may be on the organic layer 130. The second electrode 140 may be a cathode that is an electron injection electrode. A material for forming the second electrode 140 may be a metal, an alloy, and an electro-conductive compound, which have a low work function, or a mixture thereof. The second electrode 140 may include lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. To manufacture a top-emission light-emitting device, for example, the transmission electrode may include indium tin oxide (ITO) or indium zinc oxide (IZO).

When a phosphorescent dopant is used in the EML 133, for example, a HBL may be formed between the HTL 132 and the EML 133 or between the H-functional layer and the EML 133 by using vacuum deposition, spin coating, casting, LB deposition, or the like, in order to prevent diffusion of triplet excitons or holes into the ETL 135. When the HBL is formed using vacuum deposition or spin coating, for example, the conditions for deposition and coating may be similar to those for the formation of the HIL 131, although the conditions for deposition and coating may vary depending on the material that is used to form the HBL. Any suitable hole-blocking material may be used. Examples of hole-blocking materials include oxadiazole derivatives, triazole derivatives, and phenanthroline derivatives. For example, bathocuproine (BCP) represented by the following formula may be used as a material for forming the HBL.

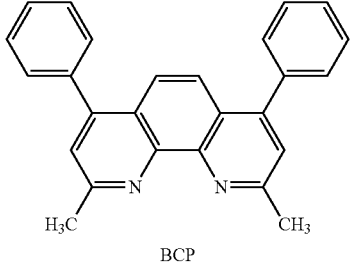

BCP

The thickness of the HBL may be from about 20 Å to about 1000 Å, or, for example, may be from about 30 Å to about 300 Å. When the thickness of the HBL is within these ranges, for example, the HBL may have improved hole blocking ability without a substantial increase in driving voltage. Other organic light-emitting devices may be employed.

As used herein, the unsubstituted $C_1$-$C_{30}$ alkyl group (or a $C_1$-$C_{30}$ alkyl group) may be a linear or branched $C_1$-$C_{30}$ alkyl group, such as a methyl group, an ethyl group, a propyl group, an isobutyl group, a sec-butyl group, a pentyl group, an iso-amyl groups, and a hexyl group. The substituted $C_1$-$C_{60}$ alkyl group may be a $C_1$-$C_{60}$ alkyl group of which at least one hydrogen atom is substituted with one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, and a $C_1$-$C_{30}$ alkoxy group;

a $C_1$-$C_{30}$ alkyl group, a $C_2$-$C_{60}$ alkenyl group, a $C_2$-$C_{30}$ alkynyl group, and a $C_1$-$C_{30}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof;

a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group;

a $C_3$-$C_{30}$ cycloalkyl group, a $C_1$-$C_{30}$ heterocycloalkyl group, a $C_3$-$C_{30}$ cycloalkenyl group, a $C_1$-$C_{30}$ heterocycloalkenyl group, a $C_6$-$C_{30}$ aryl group, a $C_6$-$C_{30}$ aryloxy group, a $C_6$-$C_{30}$ arylthio group, and a $C_2$-$C_{30}$ heteroaryl group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a phenyl group, a naphthyl group, an anthryl group, a fluorenyl group, a dimethyl fluorenyl group, a diphenyl fluorenyl group, a carbazolyl group, a phenylcarbazolyl group, a pyridyl group, a pyrimidyl group, a pyrazinyl group, a pyridazinyl group, a triazinyl group, a quinolyl group, and an isoquinolyl group; and —N(Q11)(Q12) and —Si(Q13)(Q14)(Q15), where Q11 and Q12 may be each independently a $C_6$-$C_{30}$ aryl group or a $C_1$-$C_{30}$ heteroaryl group, and Q13 to Q15 may be each independently a $C_1$-$C_{30}$ alkyl group, a $C_1$-$C_{30}$ alkoxy group, a $C_6$-$C_{30}$ aryl group, or a $C_1$-$C_{30}$ heteroaryl group.

As used herein, the unsubstituted $C_1$-$C_{30}$ alkoxy group (or a $C_1$-$C_{30}$ alkoxy group) may be a group represented by —OA, wherein A is an unsubstituted $C_1$-$C_{30}$ alkyl group described above. Examples of the unsubstituted $C_1$-$C_{30}$ alkoxy group are a methoxy group, an ethoxy group, and an isopropyloxy group. At least one of the hydrogen atoms in the alkoxy group may be substituted with the substituents described above in conjunction with the substituted $C_1$-$C_{30}$ alkyl group.

As used herein, the unsubstituted $C_2$-$C_{30}$ alkenyl group (or a $C_2$-$C_{30}$ alkenyl group) is a $C_2$-$C_{30}$ alkyl group having at least one carbon-carbon triple bond in the center or at a terminal thereof. Examples of the alkenyl group are an ethenyl group, a propenyl group, a butenyl group, and the like. At least one hydrogen atom in the unsubstituted $C_2$-$C_{30}$ alkenyl group may be substituted with those substituents described above in conjunction with the substituted $C_1$-$C_{30}$ alkyl group.

As used herein, the unsubstituted $C_2$-$C_{30}$ alkynyl group (or a $C_2$-$C_{30}$ alkynyl group) is a $C_2$-$C_{30}$ alkyl group having at least one carbon-carbon triple bond in the center or at a terminal thereof. Examples of the unsubstituted $C_2$-$C_{60}$ alkynyl group (or a $C_2$-$C_{60}$ alkynyl group) are an ethenyl group, a propynyl group, and the like. At least one hydrogen atom in the alkynyl group may be substituted with those substituents described above in conjunction with the substituted $C_1$-$C_{30}$ alkyl group.

As used herein, the unsubstituted $C_3$-$C_{30}$ cycloalkyl group (or a $C_3$-$C_{30}$ cycloalkyl group) indicates a cyclic, monovalent $C_3$-$C_{30}$ saturated hydrocarbon group. Non-limiting examples of the unsubstituted $C_3$-$C_{30}$ cycloalkyl group are a cyclopropyl group, a cyclobutyl group, a cyclopentyl group, a cyclohexyl group, and a cyclooctyl group. At least one hydrogen atom in the cycloalkyl group may be substituted with those substituents described above in conjunction with the substituted $C_1$-$C_{30}$ alkyl group.

As used herein, the unsubstituted $C_3$-$C_{30}$ cycloalkenyl group indicates a nonaromatic, cyclic unsaturated hydrocarbon group with at least one carbon-carbon double bond. Examples of the unsubstituted $C_3$-$C_{30}$ cycloalkenyl group are a cyclopropenyl group, a cyclobutenyl group, a cyclopentenyl group, a cyclohexenyl group, a cycloheptenyl group, a 1,3-cyclohexadienyl group, a 1,4-cyclohexadienyl group, a 2,4-cycloheptadienyl group, and a 1,5-cyclooctadienyl group. At least one hydrogen atom in the cycloalkenyl group may be substituted with those substituents described above in conjunction with the substituted $C_1$-$C_{30}$ alkyl group.

As used herein, the unsubstituted $C_{30}$-$C_{30}$ aryl group is a monovalent group having a carbocyclic aromatic system having 6 to 30 carbon atoms including at least one aromatic ring. The unsubstituted $C_{30}$-$C_{60}$ arylene group is a divalent group having a carbocyclic aromatic system having 6 to 30 carbon atoms including at least one aromatic ring. When the aryl group and the arylene group have at least two rings, they may be fused to each other via a single bond. At least one hydrogen atom in the aryl group and the arylene group may be substituted with those substituents described above in conjunction with the $C_1$-$C_{30}$ alkyl group.

Examples of the substituted or unsubstituted $C_6$-$C_{30}$ aryl group are a phenyl group, a $C_1$-$C_{30}$ alkylphenyl group (e.g., an ethylphenyl group), a $C_1$-$C_{30}$ alkylbiphenyl group (e.g., an ethylbiphenyl group), a halophenyl group (e.g., an o-, m-, or p-fluorophenyl group and a dichlorophenyl group), a dicyanophenyl group, a trifluoromethoxyphenyl group, an o-, m-, or p-tolyl group, an o-, m-, or p-cumenyl group, a mesityl group, a phenoxyphenyl group, a (α,α-dimethylbenzene)phenyl group, a (N,N-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, and a Spiro-fluorenyl group. Examples of the substituted $C_6$-$C_{30}$ aryl group may be inferred based on those of the unsubstituted $C_6$-$C_{30}$ aryl group and the substituted $C_1$-$C_{30}$ alkyl group described above. Examples of the substituted or unsubstituted $C_6$-$C_{30}$ arylene group may be inferred based on those examples of the substituted or unsubstituted C6-C30 aryl group described above.

As used herein, the unsubstituted $C_1$-$C_{30}$ heteroaryl group (or a $C_1$-$C_{30}$ heteroaryl group) is a monovalent carbocyclic aromatic system having at least one aromatic ring and at least one of the heteroatoms selected from the group consisting of N, O, P, and S as a ring-forming atom. The unsubstituted $C_1$-$C_{30}$ heteroarylene group is a divalent carbocyclic aromatic system having at least one aromatic ring and at least one of the heteroatoms selected from the group consisting of N, O, P, and S. In this regard, when the heteroaryl group and the heteroarylene group have at least two rings, they may be fused to each other via a single bond. At least one hydrogen atom in the heteroaryl group and the heteroarylene group may be substituted with those substituents described with reference to the $C_1$-$C_{60}$ alkyl group.

Examples of the unsubstituted $C_1$-$C_{30}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the substituted or unsubstituted C1-C30 heteroarylene group may be inferred based on those examples of the substituted or unsubstituted $C_6$-$C_{30}$ arylene group described above.

The substituted or unsubstituted $C_6$-$C_{30}$ aryloxy group indicates —OA2 (where A2 is a substituted or unsubstituted $C_6$-$C_{30}$ aryl group described above). The substituted or unsubstituted $C_6$-$C_{30}$ arylthiol group indicates —SA3 (where A3 is a substituted or unsubstituted $C_6$-$C_{30}$ aryl group described above).

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis Example 1: Synthesis of Compound 1

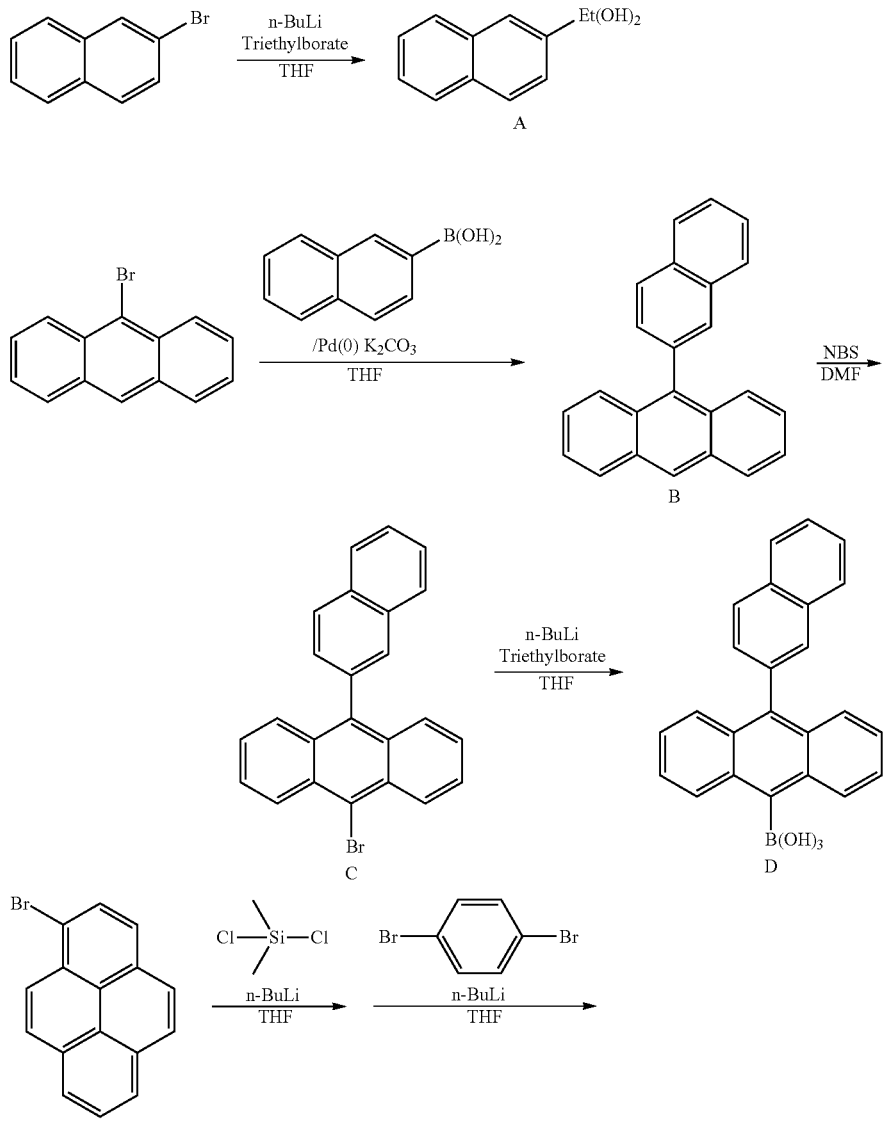

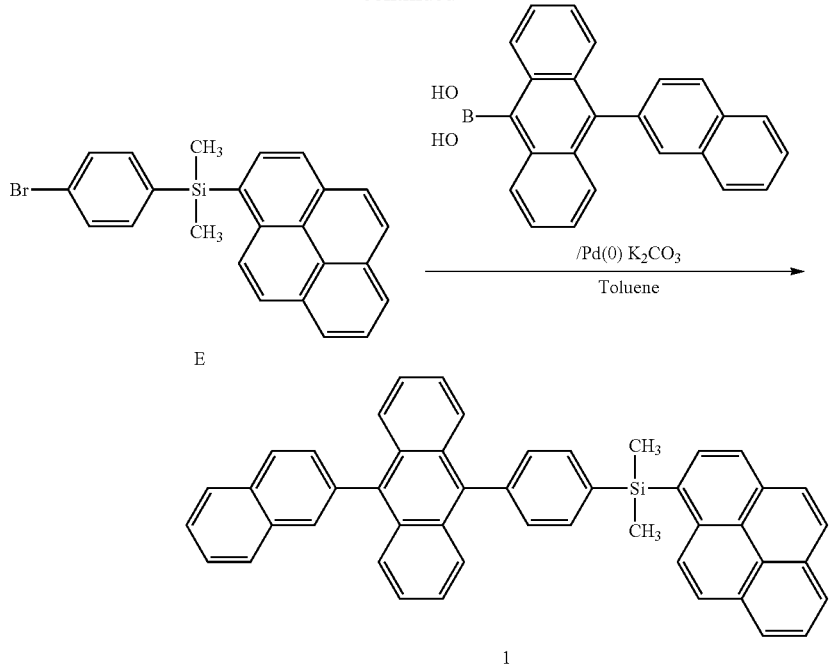

Synthesis of Compound A 20.0 g (96.6 mmol) of 2-bromonaphthalene and 100 ml of tetrahydrofuran (THF) were put into a 500-mL three-necked flask in a nitrogen atmosphere, followed by cooling to about −78° C. Then, 42.4 mL (106.2 mmol) of n-BuLi (2.5M in hexane) was slowly dropwise added thereto over 30 minutes, stirred for about 1 hour, followed by adding 18 mL (106.2 mmol) of triethylborate and further stirring for about 12 hours. An excess of a 2M HCl solution was added to terminate the reaction. After about 1 hour, the reaction product was extracted with 300 mL of dichloromethane and water to collect an organic phase. The organic phase was dried using magnesium sulfate ($MgSO_4$) to remove water, and then distilled to remove the solvent. The resulting product was washed with excess n-hexane and filtered through a glass filter to obtain Compound A (white, 12.85 g, Yield: 77.4%). This compound was structurally identified using $^1$H-nuclear magnetic resonance (NMR). $^1$H NMR (300 MHz, a CDCl3): δ 8.38 (s, 1H), 8.17 (s, 2H), 7.83-7.94 (m, 4H), 7.47-7.55 (m, 2H).

Synthesis of Compound B 19 g (73.89 mmol) of 9-bromoanthracene and 19 g (110.84 mmol) of Compound A were put in to a 1000-mL three-necked flask, and dissolved with 240 mL of THF, followed by adding 60 mL of a 2M NaOH solution thereto, and bubbling nitrogen thereinto for about 1 hour to remove oxygen. After the temperature was increased to about 50° C., 0.27 g (0.3% mol) of $Pd(PPh_3)_4$ as a catalyst was added thereto, the temperature was increased to about 90° C. and the reaction mixture was stirred for about 12 hours. About 70 mL of a 2M HCl solution was added to terminate the reaction, the reaction product was stirred for about 1 hour, filtered, and washed with dichloromethane to obtain Compound B (21.90 g, Yield: 97.4%). This compound was structurally identified using $^1$H-NMR. $^1$H NMR (300 MHz, a $CDCl_3$): δ 8.54 (s, 1H), 7.98-8.09 (m, 4H), 7.89-7.95 (m, 2H), 7.69-7.72 (m, 2H), 7.57-7.61 (m, 3H), 7.44-7.50 (m, 2H), 7.30-7.34 (m, 2H).

Preparation of Compound C 21 g (69.00 mmol) of Compound B and 400 mL of 9-bromoanthracene and 21 g (69.00 mmol) of dimethylformamide (DMF) were put into a 1000-mL three-necked flask equipped with a dropping funnel, and a solution of N-bromosuccinimide (NBS) (19 g, 103.50 mmol) in 100 mL of DMF was put into the dropping funnel. The temperature was increased to about 60° C. to allow one droplet of the NBS solution to be dropped per second. After all of the NBS solution was dropped through the dropping funnel, the reaction mixture was further stirred for about 4 hours. Then, water was added thereto in an ice bath to terminate the reaction, followed by filtering through a glass filter. The residue was washed several times with water and finally with ethanol, and then dried. The resulting product was purified by column chromatography using hexane and toluene as eluents to obtain Compound C (21.10 g, Yield: 79.8%). This compound was structurally identified using $^1$H-NMR. $^1$H NMR (300 MHz, a $CDCl_3$): δ 8.67-8.65 (d, 2H), 7.99-8.07 (m, 2H), 7.84-7.89 (m, 2H), 7.64-7.66 (d, 2H), 7.56-7.60 (m, 4H), 7.50-7.52 (m, 1H), 7.32-7.35 (m, 2H).

Preparation of Compound D 21 g (54.79 mmol) of Compound C was put into a 1000-mL three-necked flask in a nitrogen atmosphere, and dissolved in 280 mL of THF, followed by cooling to about −78° C., adding 25 mL of n-BuLi (2.5M) and stirring for about 1 hour. Then, 11 mL (60.27 mmol) of triethylborate was added thereto and stirred for about 12 hours. About 50 mL of a 2M HCl solution was added to terminate the reaction. After 1 hour, the reaction product was extracted with dichloromethane, followed by removing the solvent to obtain a crude product. Excess amounts of n-hexane and toluene were added thereto, stirred at about 70° C., and filtered to obtain Compound D (17.34 g, Yield: 74.8%). This compound was structurally identified using $^1$H-NMR. $^1$H NMR (300 MHz, a $CDCl_3$): δ 5.25 (s, 2H), 7.35 (t, 2H), 7.51-7.47 (m, 3H), 7.67 (t, 2H), 7.70 (d, 2H), 7.89 (m, 2H), 8.06-8.00 (m, 2H), 8.19 (d, 2H).

Preparation of Compound E

After 11.98 g (0.042 mol) of 1-bromopyrene was dissolved in 180 mL of THF in a 500-mL three-necked round-bottomed flask (flask 1) in a nitrogen atmosphere, 17.05 mL (0.042 mol) of n-BuLi was slowly dropped into the solution at about −78° C. and stirred for about 20 minutes at the same temperature. 5 g (0.039 mol) of dimethyldichlorosilane was slowly dropped into the solution at about −80° C. or less, and then the temperature was increased to about −10° C. or less, at which the solution was stirred for about 2 hours. After 13.7 g (0.058 mol) of 1,4-dibromobenzene was dissolved in 150 mL of THF in a 250-mL three-necked round flask (flask 2) in a nitrogen atmosphere, 23.25 mL (0.058 mmol) of n-BuLi (2.5M in hexane) was slowly dropped into the solution at about −78° C. and stirred for about 20 minutes at the same temperature. While the flasks 1 and 2 were maintained at about −78° C., the reaction product in the flask 2 was taken using a syringe, dropwise added into the flask 1, and then stirred for about 12 hours. After termination of the reaction using H$_2$O, the reaction product was extracted with 300 mL of dichloromethane, followed by separation by column chromatography using n-hexane as an eluent and then recrystallization using hexane to obtain Compound E (10.15 g, Yield: 63.29%). This compound was structurally identified using $^1$H-NMR. $^1$H NMR (300 MHz, a CDCl$_3$) δ: 8.23-7.99 (m, 9H), 7.51-7.43 (m, 4H), 0.84 (s, 6H).

Synthesis of Compound 1

After 1 g (2.4 mmol) of Compound E and 1.1 g (2.6 mmol) of Compound D were dissolved in 50 mL of toluene in a 500-mL three-necked flask, 12 mL of a K$_2$CO$_3$ solution (2M) was added thereto, followed by bubbling nitrogen thereinto to remove oxygen. After the temperature was increased to about 50° C., 0.28 g (0.24 mmol) of Pd(PPh$_3$)$_4$ as a catalyst was added thereto, the temperature was increased to about 90° C. and the reaction mixture was stirred for about 24 hours. 20 mL of a HCl solution (2M) was added thereto, and stirred for about 1 hour, followed by extraction with 300 mL of dichloromethane, and removing the solvent. The resulting crude reaction product was separated by column chromatography using hexane and dichloromethane (4:1) as eluents, followed by recrystallization using toluene to obtain Compound 1 (0.53 g, Yield: 35%). This compound was structurally identified using $^1$H-NMR and high-resolution mass spectrometry (HR-MS). $^1$H NMR (300 MHz, DMSO): δ 8.40-8.36 (m, 5H), 8.29-8.23 (m, 3H), 8.19 (d, 1H), 8.13 (t, 2H), 7.90 (t, 2H), 7.80 (t, 1H), 7.64-7.50 (m, 6H), 7.43-7.38 (m, 2H), 7.35-7.24 (m, 5H), 0.98 (s, 6H); HR-MS (FAB+): C$_{48}$H$_{34}$Si calcd.: 638.2430. found (M+): 639.2508.

Synthesis Example 2: Synthesis of Compound 25

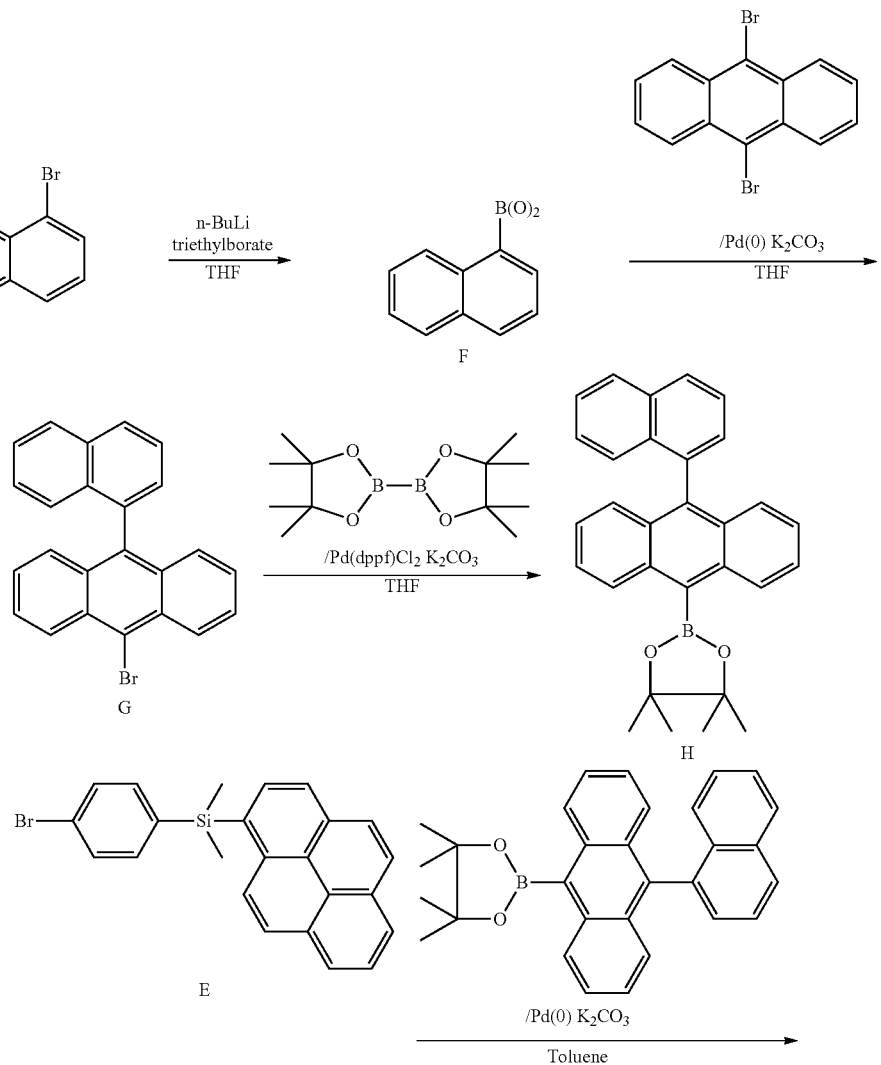

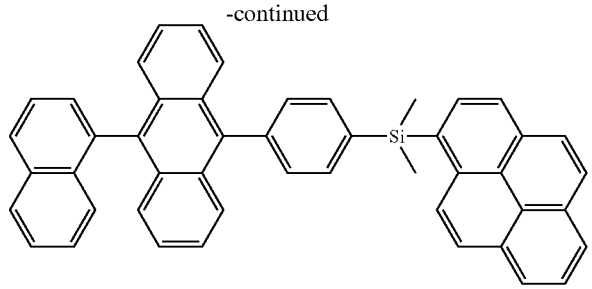

25

Synthesis of Compound F 20 g (0.096 mol) of 1-bromonaphthalene and THF were put into a 500-mL three-necked flask, followed by cooling to about −78° C. 42.5 mL (0.106 mmol) of n-BuLi (2.5M in hexane) was added thereto and stirred for about 1 hour. After cooling to about −78° C., 18 mL (0.106 mol) of triethylborate was added thereto and stirred for about 6 hours. An excess (300 mL) of a 2M HCl solution was added to terminate the reaction. After 1 hour, the reaction product was extracted with dichloromethane and water to collect an organic phase. The organic phase was dried using anhydrous magnesium sulfate to remove water, followed by distillation to remove the solvent. The resulting product was dissolved in hexane and filtered through a glass filter to obtain Compound F (10.67 g, Yield: 62.24%). This compound was structurally identified using $^1$H-NMR. $^1$H-NMR (300 MHz, DMSO): δ8.38-8.34 (m, 1H), 7.91-7.86 (m, 2H), 7.74-7.72 (t, 1H), 7.71-7.44 (m, 3H).

Synthesis of Compound G

After 7 g (0.0407 mol) of 1-naphthalene boronic acid and 17.8 g (0.0529 mol) of 9,10-dibromoanthracene were dissolved in THF as a solvent in a 500-mL three-necked flask in a nitrogen atmosphere, a 2M $K_2CO_3$ solution was added thereto and then refluxed in an oil bath. After the temperature reached to about 50° C., 0.3 g of Pd(PPh$_3$)$_4$ as a catalyst was added thereto and reacted for about 16 hours to 24 hours while the temperature was maintained at about 80~90° C. The reaction product was extracted using 300 mL of dichloromethane to collect an organic phase. The organic phase was dried to remove water, followed by distillation to remove the solvent and then separation by column chromatography using hexane as an eluent to obtain Compound G (9.7 g, Yield: 62.1%). This compound was identified using $^1$H-NMR. $^1$H-NMR (300 MHz, DMSO): δ8.58-8.55 (d, 2H), 8.18-8.10 (d, 2H), 7.77-7.67 (m, 3H), 7.57-7.54 (m, 2H), 7.40-7.37 (m, 2H), 7.30-7.27 (m, 3H), 6.84-6.82 (d, 1H).

Synthesis of Compound H

After 7 g (0.018 mol) of 9-bromo-10-naphthylanthracene, and 5.1 g (0.020 mol) of bis(pinacolato)diboron were sufficiently dissolved in 150 mL of THF in a 500-mL three-necked flask, 40 mL of a 2M $K_2CO_3$ solution was added thereto and refluxed in an oil bath. After the temperature reached to about 50° C., 0.15 g (0.018 mmol) of Pd(dppf)Cl$_2$ was added thereto and reacted for about 16 hours while the temperature was maintained at about 80~90° C. The reaction product was extracted using 300 mL of dichloromethane (CH$_2$Cl$_2$). The organic phase was collected, and then dried, and the solvent was removed therefrom. The resulting product was separated by column chromatography using hexane and CH$_2$Cl$_2$ as eluents to obtain Compound H (4.1 g, Yield: 52%). This compound was structurally identified using $^1$H-NMR. $^1$H-NMR (300 MHz, DMSO): δ8.38-8.35 (d, 2H), 8.19-8.10 (q, 2H), 7.80-7.75 (t, 1H), 7.66-7.49 (m, 4H), 7.37-7.20 (m, 5H), 6.81-6.78 (d, 1H), 1.57 (s, 12H).

Synthesis of Compound E

After 11.98 g (0.042 mol) of 1-bromopyrene was dissolved in 180 mL of THF in a 500-ml three-necked round flask (flask 1) in a nitrogen atmosphere, 17.05 mL (0.042 mol) of n-BuLi (2.5 M) was slowly dropped into the solution at about −78° C. and stirred for about 20 minutes while the temperature was maintained. 5 g (0.039 mol) of dimethyldichlorosilane was slowly dropwise added into the mixture at about −80° C. or less, and the temperature was slowly increased to about −10° C. or less, at which the mixture was further stirred for about 2 hours. After 13.7 g (0.058 mol) of 1,4-dibromobenzene was dissolved in 150 mL of THF in a 250-ml three-necked flask (flask 2) in a nitrogen atmosphere, 23.25 mL (0.058 mol) of n-BuLi was slowly dropped into the solution at about −78° C. and stirred for about 20 minutes while the temperature was maintained. While the temperatures of the reaction products in flasks 1 and 2 were maintained at about −78° C., the reaction product in flask 2 was taken using a syringe, dropwise added into flask 1, and then stirred for about 12 hours. After termination of the reaction using water, the reaction product was extracted using chloroform, followed by separation by column chromatography using n-hexane as an eluent and then recrystallization using hexane to obtain Compound E as white solid (10.15 g, Yield: 63.29%). This compound was structurally identified using $^1$H-NMR. $^1$H NMR (300 MHz, a CDCl$_3$) δ: 8.23-7.99 (m, 9H), 7.51-7.43 (m, 4H), 0.84 (s, 6H).

Synthesis of Compound 25

2.35 g (0.057 mol) of Compound E and 2.6 g (0.062 mol) of Compound H were put into a 500-mL three-necked flask, and dissolved in 130 mL of toluene. After 28 mL of a 2M $K_2CO_3$ solution was added thereto, the reaction solution was refluxed in an oil bath. After the temperature was increased to about 50~60° C., a Pd(0) catalyst was added thereto and reacted at about 80~90° C. for about 24-36 hours. An excess of a HCl solution was added to terminate the reaction, followed by extraction using 300 mL of dichloromethane (CH$_2$Cl$_2$), and removing water and the solvent. The resulting product was separated by column chromatography using hexane and CH$_2$Cl$_2$ as eluents, followed by recrystallization using toluene to obtain Compound 25 (0.94 g, Yield: 25.5%). This structure was structurally identified using $^1$H-NMR, and HR-MS. $^1$H-NMR (300 MHz, DMSO) δ8.40-8.36 (m, 5H), 8.29-8.23 (m, 3H), 8.19-8.17 (d, 1H), 8.13-8.09 (t, 2H), 7.90-7.86 (t, 2H), 7.80-7.75 (t, 1H), 7.64-7.50

(m, 6H), 7.43-7.38 (m, 2H), 7.35-7.24 (m, 5H), 0.98 (s, 6H). HR-MS (FAB+): $C_{48}H_{35}Si$, calcd.: 638.2430. found (M+): 639.2508.

Example 1

To manufacture an anode, a glass substrate with deposited ITO/Ag/ITO layers (70/1000/70 Å) was cut to a size of 50 mm×50 mm×0.5 mm and then ultrasonicated in isopropyl alcohol and pure water each for 10 minutes, and then cleaned by irradiation of ultraviolet rays for 10 minutes and exposure to ozone. The resulting glass substrate was loaded into a vacuum deposition device. After 2-TNATA was vacuum-deposited on the anode to form an HIL having a thickness of 700 Å, Compound 311 was deposited on the HIL to form a HTL having a thickness of about 500 Å, and then Compound 1 (host) and Compound 101 (dopant) were co-deposited in a weight ratio of 200:3 on the HTL to form an EML having a thickness of about 200 Å. After Compound 201 and lithium quinolate (LiQ) were co-deposited in a weight ratio of 5:5 on the EML to form an ETL having a thickness of about 300 Å, LiQ was deposited on the ETL to form an EIL having a thickness of about 10 Å, and Mg and Al were deposited in a weight ratio of 130:10 on the EIL to form a cathode having a thickness of about 130 Å, thereby completing the manufacture of the organic light-emitting device.

311

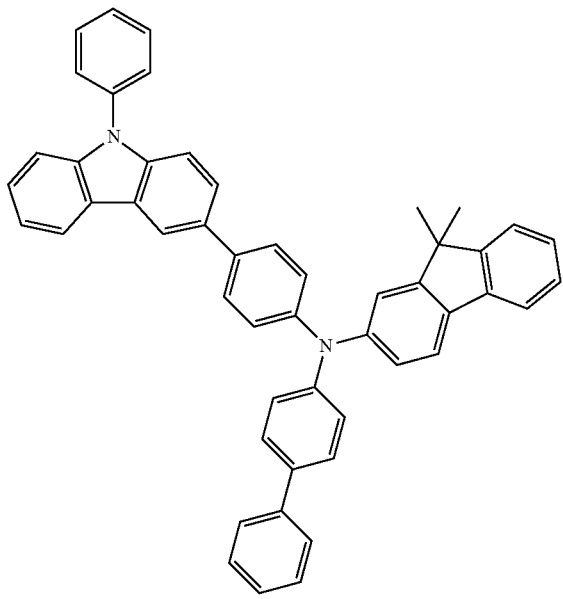

101

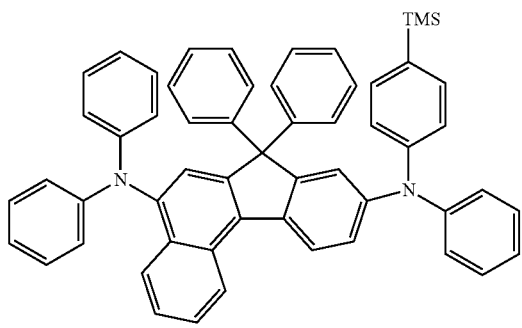

201

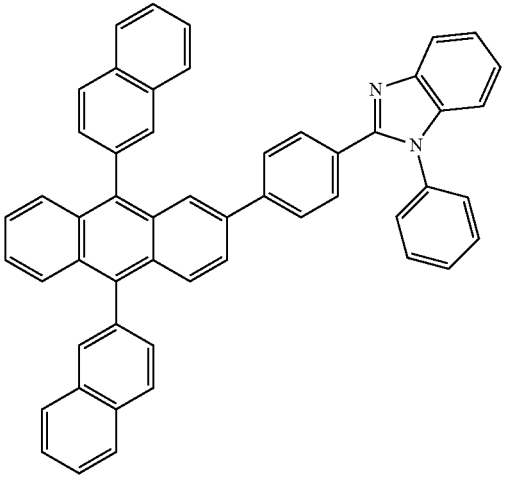

Example 2

An organic light-emitting device was manufactured in the same manner as in Example 1, except that Compound 25, instead of Compound 1, was used to form the EML.

Comparative Example

An organic light-emitting device was manufactured in the same manner as in Example 1, except that Compound X, instead of Compound 1, was used to form the EML.

<Compound X>

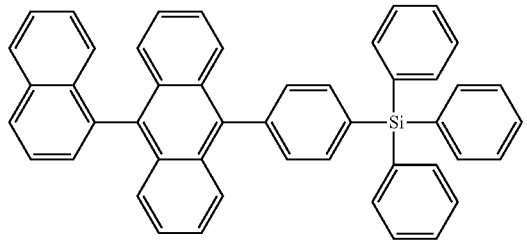

Evaluation Example 1

Figure 2:
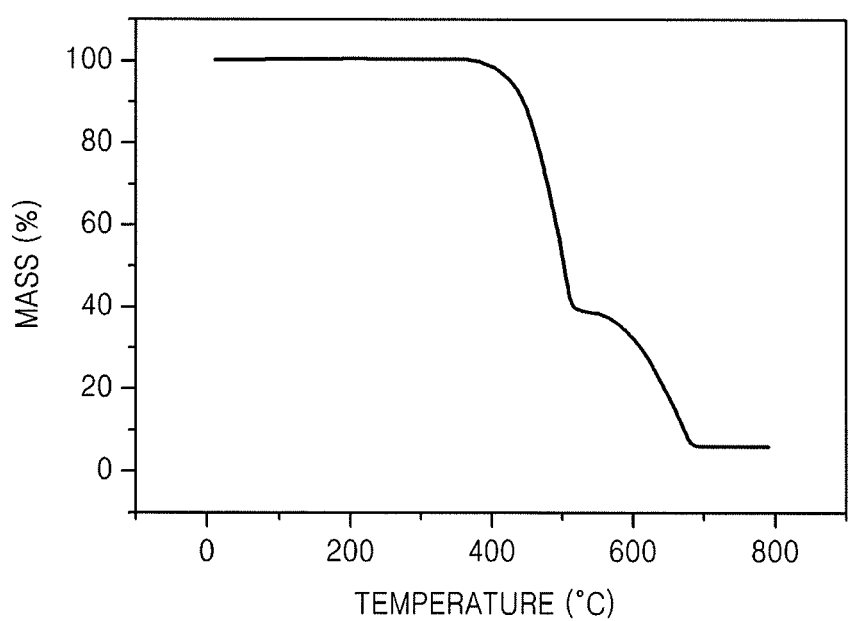
FIG. 2 illustrates a graph of results of thermogravimetry analysis (TGA) on Compound 1.
Figure 3:
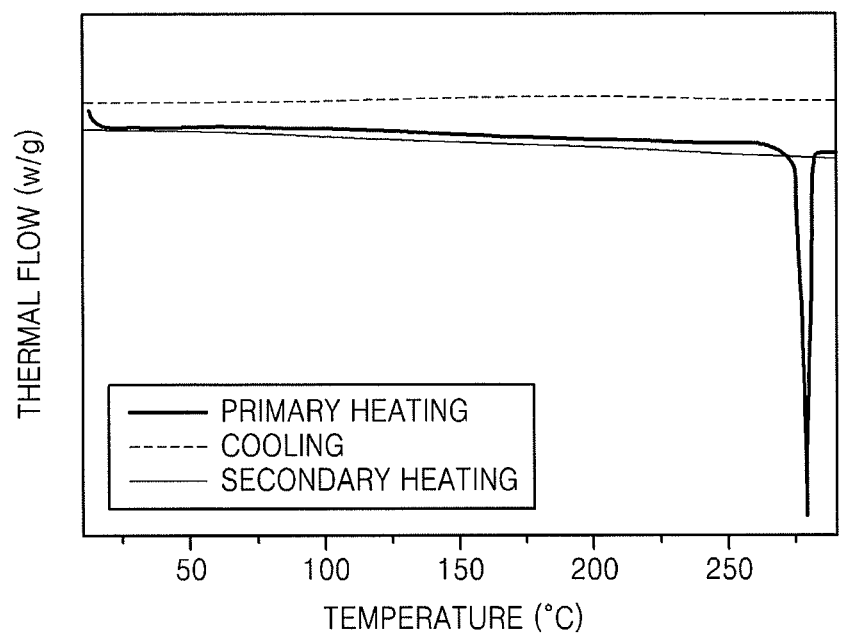
FIG. 3 illustrates a graph of results of differential scanning calorimetry (DSC) on Compound 1.
Figure 4:
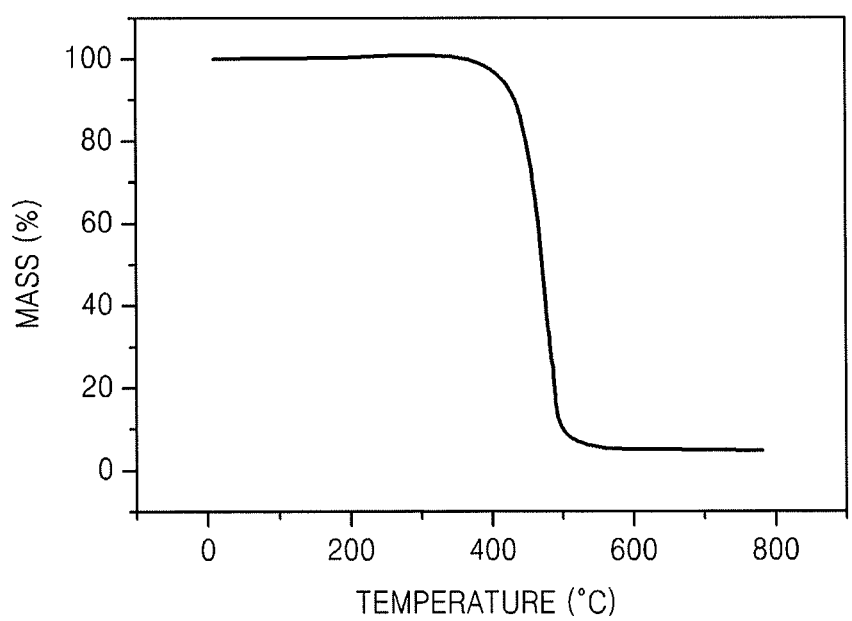
FIG. 4 illustrates a graph of results of TGA on Compound 25.
Figure 5:
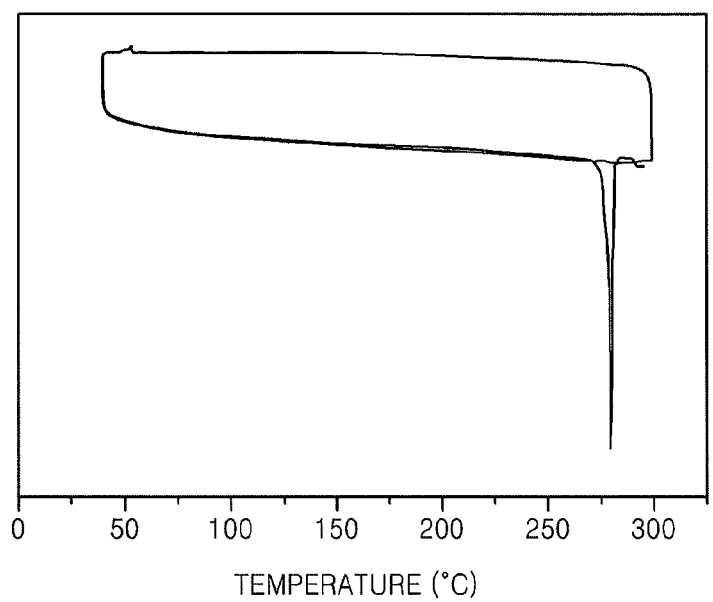
FIG. 5 illustrates a graph of results of DSC on Compound 25.

Compounds 1 and 25 were analyzed by thermogravimetric analysis (TGA) and differential scanning calorimetry (DSC), in which the temperature was increased from about 40° C. to about 800° C. at a rate of 10° C./min in a nitrogen atmosphere. The analysis results of Compound 1 are shown in FIGS. 2 and 3. The analysis results of Compound 25 are shown in FIGS. 4 and 5. The temperatures at which Compounds 1 and 25 had a mass loss of about 5% were about 377° C. and 422° C., respectively. The analysis results indicate that the anthracene-based compound of Formula 1 has high thermal stability.

Evaluation Example 2

Figure 6:
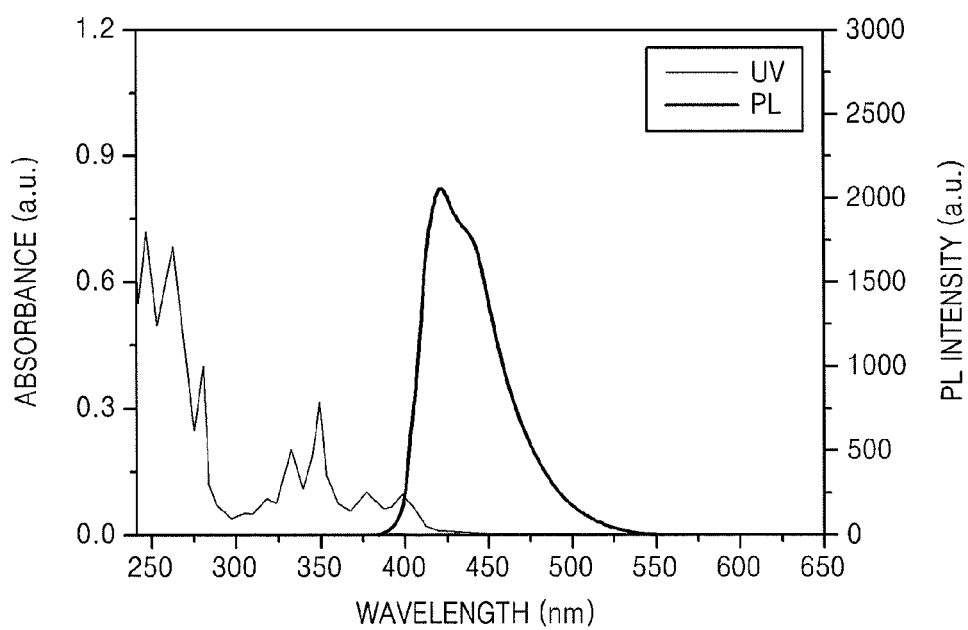
FIG. 6 illustrates a graph of UV absorption spectra and photoluminescence (PL) spectra of Compound 1 in solution.

Compounds 1 and 25 were each dissolved at a concentration of $1 \times 10^{-5}$ M in chloroform solvent to obtain UV and photoluminescence (PL) spectra. The results are shown in FIGS. 6 and 7. Compounds 1 and 25 had maximum peaks at the same wavelength of 412 nm in the PL spectra.

Evaluation Example 3

Electrochemical characteristics of Compounds 1 and 25 were evaluated by cyclic voltammetry. The results are shown in FIGS. 8 and 9. Compound 1 had a highest occupied molecular orbital (HOMO) energy level of about 5.85 eV, a lowest unoccupied molecular orbital (LUMO) energy level of about 2.86 eV, and a band gap of about 2.99 eV. The band gap of Compound 1 was nearly the same as that of Compound 25.

Evaluation Example 4

Driving voltages, current densities, luminances, emission colors, efficiencies, and half-life spans (@50 mA/cm$^2$) of the organic light-emitting devices of Examples 1 and 2 and Comparative Example were measured using a PR650 (Spectroscan) Source Measurement Unit (available from Photo Research, Inc.). The results are shown in Table 1.

TABLE 1

| Example | EML material | Driving voltage (V) | Current density (mA/cm$^2$) | Luminance (cd/m$^2$) | Efficiency (cd/A) | Tg (° C.) | Emission color |
|---|---|---|---|---|---|---|---|
| Comparative Example | Compound X | 4.10 | 15.3 | 600 | 3.7 | 101 | Blue |
| Example 1 | Compound 1 | 4.80 | 13.1 | 600 | 5.2 | 137 | Blue |
| Example 2 | Compound 25 | 4.90 | 12.6 | 600 | 6.2 | 136 | Blue |

Referring to Table 1, the organic light-emitting devices of Examples 1 and 2 were found to have improved efficiencies by about 30%, compared to the organic light-emitting device of Comparative Example. Compounds 1 and 2 used in Examples 1 and 2, respectively, also had higher glass transition temperatures by about 30° C. or higher than Compound X used in Comparative Example, indicating the organic light-emitting devices of Examples 1 and 2 have improved thermal stability. The film characteristics and electrical characteristics of the organic light-emitting devices of Examples 1 and 2 may be less changed in high-temperature deposition conditions, compared to those of the organic light-emitting device of Comparative Example.

By way of summation and review, an anthracene-based compound of Formula 1 may have improved thermal stability and improved optical and chemical characteristics. Accordingly, a high-quality organic light-emitting device emitting blue light may be manufactured using the anthracene-based compound of Formula 1. An anthracene-based compound and a high-quality organic light-emitting device including the anthracene-based compound are provided herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An anthracene-based compound represented by Formula 1a:

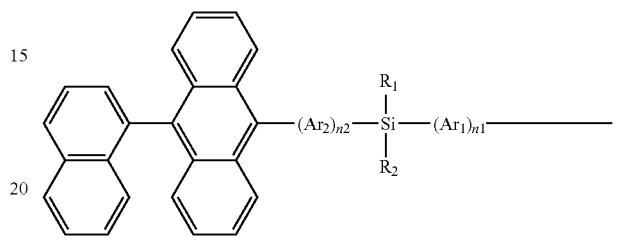

<Formula 1a>

-continued wherein, in Formula 1a and 1b,
Ar$_1$ and Ar$_2$ are each independently selected from
i) a phenylene group, a naphthylene group, and an anthracenylene group, and
ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tert-butyl group;
n1 and n2 are each independently an integer from 0 to 2;
a sum of n1 and n2 is 1 or greater; and
R$_1$ and R$_2$ are each independently selected from
i) a methyl group, an ethyl group, and an n-propyl group,
ii) a methyl group, an ethyl group, and an n-propyl group, each substituted with a deuterium atom, a halogen atom, a cyano group, and a nitro group,
iii) a phenyl group, a naphthyl group, and an anthryl group, and
iv) a phenyl group, a naphthyl group, and an anthryl group, each substituted with at least one of a deuterium atom, a halogen atom, a cyano group, a nitro group, a methyl group, an ethyl group, and an n-butyl group;
R$_3$ and R$_4$ are each independently selected from a hydrogen atom, a deuterium atom, a halogen atom, a hydroxyl group, a cyano group, and a nitro group;

a1 is 5; and a2 is 4.

2. The anthracene-based compound as claimed in claim 1, wherein, in Formula 1a, $(Ar_1)_{n1}$ and $(Ar_2)_{n2}$ are each independently selected from groups represented by Formulae 3-1 to 3-10:

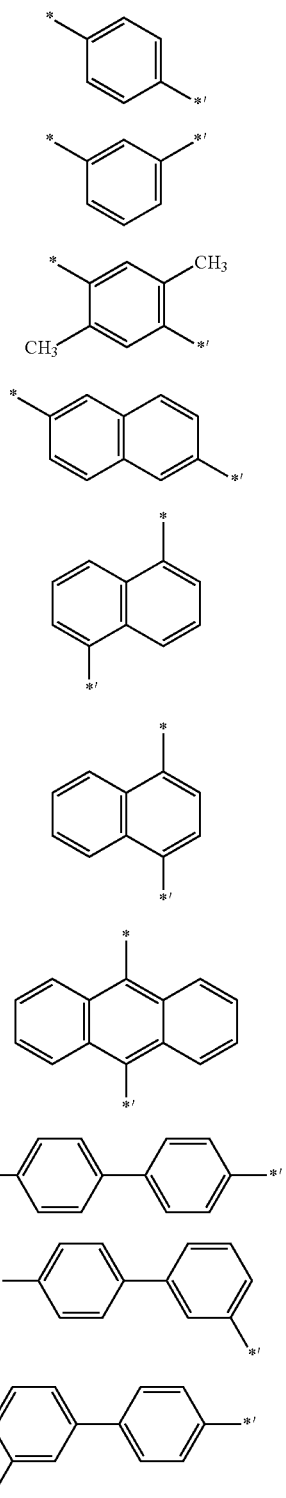

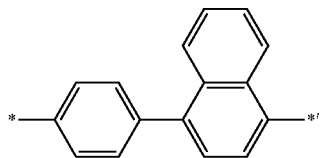

wherein, in Formulae 3-1 to 3-11, * indicates a binding site to an anthracene ring, and *' indicates a binding site to a silicon (Si) atom;

$R_1$ and $R_2$ are each independently selected from a methyl group, an ethyl group, a phenyl group, and a 2-naphthyl group;

$R_3$ and $R_4$ are each independently selected from a hydrogen atom, a deuterium atom, a halogen atom, a hydroxyl group, a cyano group, and a nitro group;

a1 is 5; and a2 is 4.

3. The anthracene-based compound as claimed in claim 1, wherein the anthracene-based compound of Formula 1a is a compound represented by one selected from Formulae 1c to 1e:

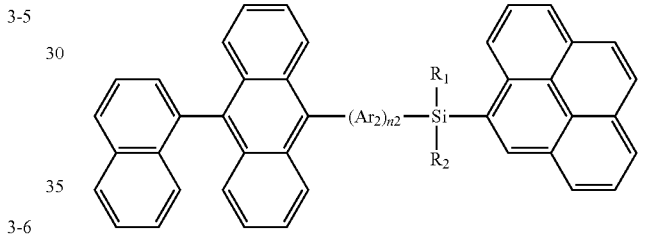

<Formula 1c>

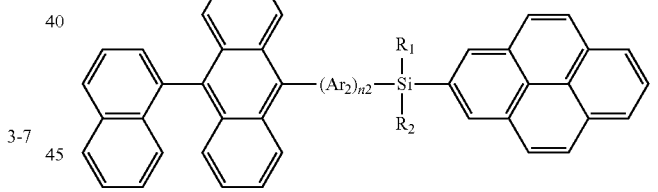

<Formula 1d>

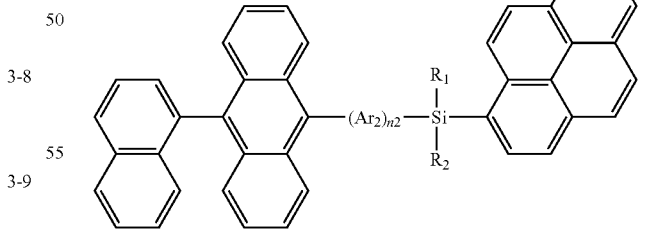

<Formula 1e> wherein, in Formulae 1c to 1e, $Ar_2$ is selected from
i) a phenylene group, a naphthylene group, and an anthracenylene group, and
ii) a phenylene group, a naphthylene group, and an anthracenylene group, each substituted with at least one selected from a deuterium atom, a halogen atom, a hydroxyl group, a cyano group, a nitro group, a methyl group, an ethyl group, a n-propyl group, an iso-propyl group, a n-butyl group, a sec-butyl group, an iso-butyl group, and a tort-butyl group;
n2 is an integer of 1 or 2; and
$R_1$ and $R_2$ are each independently selected from
i) a methyl group, an ethyl group, and an n-propyl group,
ii) a methyl group, an ethyl group, and an n-propyl group, each substituted with a deuterium atom, a halogen atom, a cyano group, and a nitro group,
iii) a phenyl group, a naphthyl group, and an anthryl group, and
iv) a phenyl group, a naphthyl group, and an anthryl group, each substituted with at least one of a deuterium atom, a halogen atom, a cyano group, a nitro group, a methyl group, an ethyl group, and an n-butyl group.

4. The anthracene-based compound as claimed in claim 1, wherein the anthracene-based compound is a compound represented by one selected from Formulae 1c to 1e:

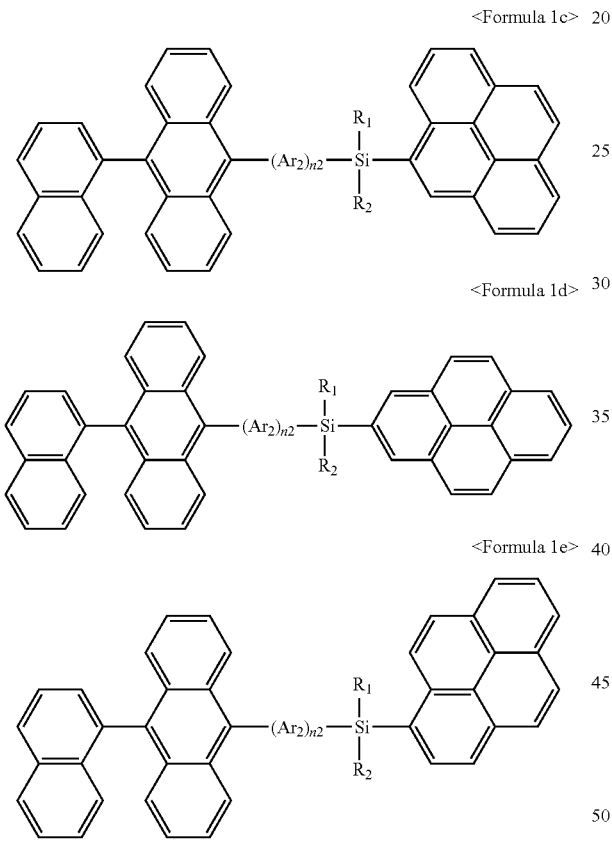

<Formula 1c>

<Formula 1d>

<Formula 1e> wherein, in Formulae 1c to 1e, $(Ar_2)_{n2}$ is a group represented by one selected from Formulae 3-1 to 3-11:

3-1

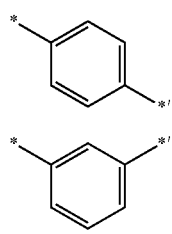

3-2

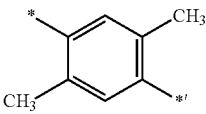 3-3

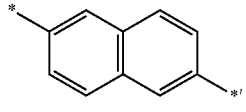 3-4

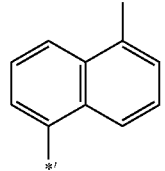 3-5

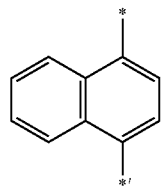 3-6

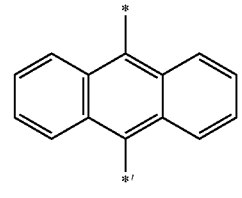 3-7

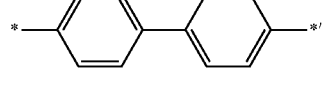 3-8

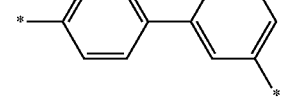 3-9

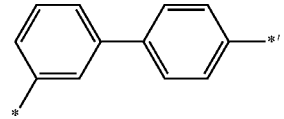 3-10

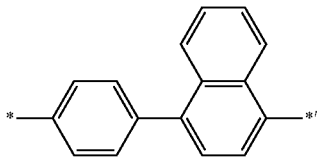 3-11 wherein, in Formulae 3-1 to 3-11, * indicates a binding site to an anthracene ring, and *' indicates a binding site to a silicon (Si) atom; and $R_1$ and $R_2$ are each independently selected from a methyl group, an ethyl group, a phenyl group, and a 2-naphthyl group.

5. The anthracene-based compound as claimed in claim 1, wherein the anthracene-based compound of Formula 1 is a compound selected from Compounds 17 to 32:

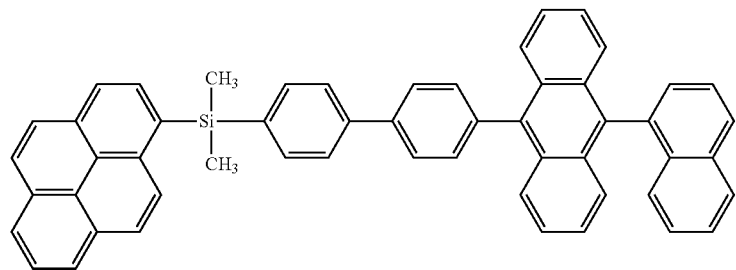
<Compound 17>
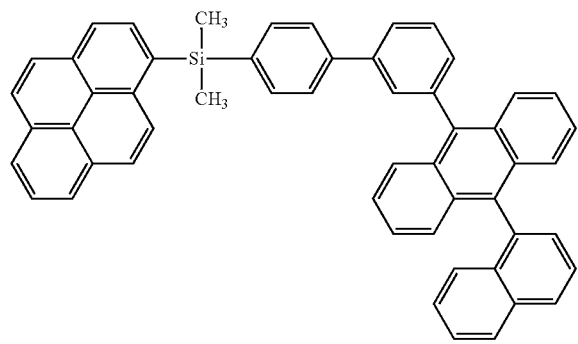
<Compound 18>
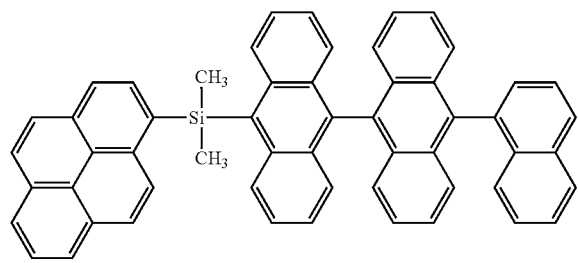
<Compound 19>
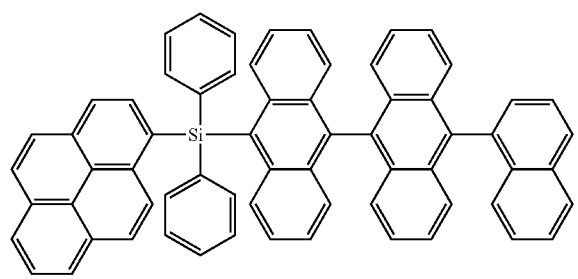
<Compound 20>
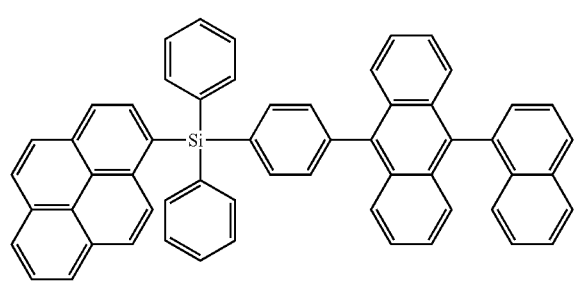
<Compound 21>

-continued
<Compound 22>
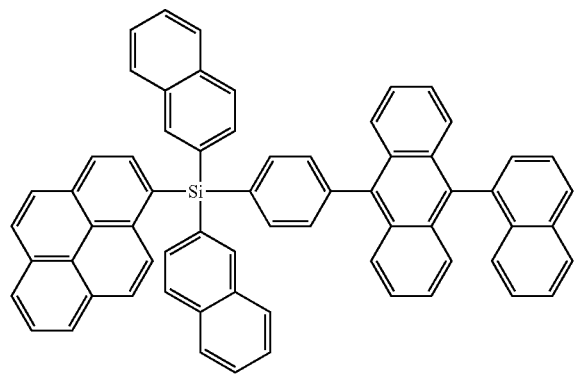
<Compound 23>
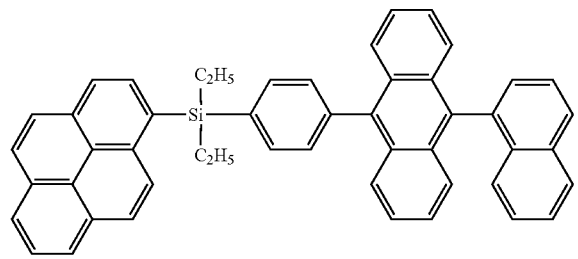
<Compound 24>
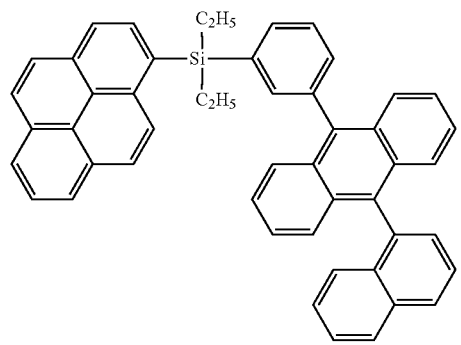
<Compound 25>
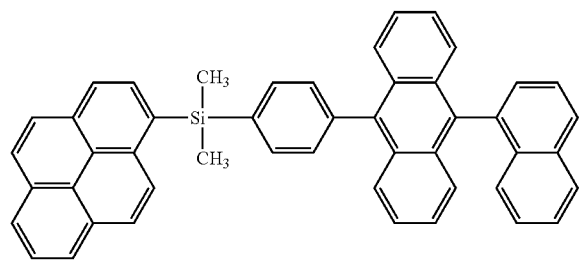
<Compound 26>
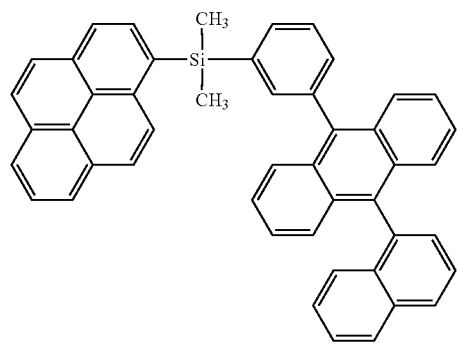
<Compound 27>
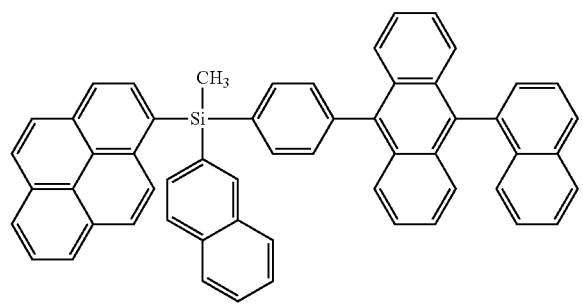
<Compound 28>
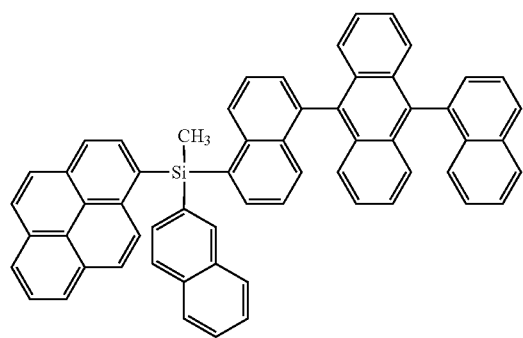
<Compound 29>
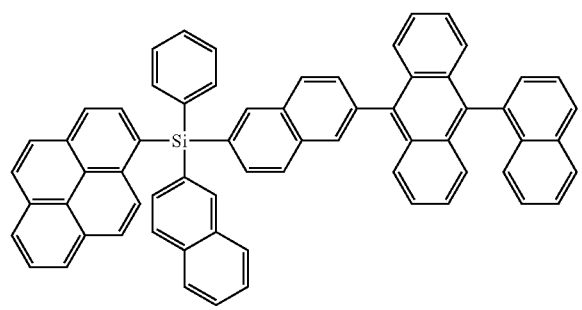

-continued

<Compound 30>

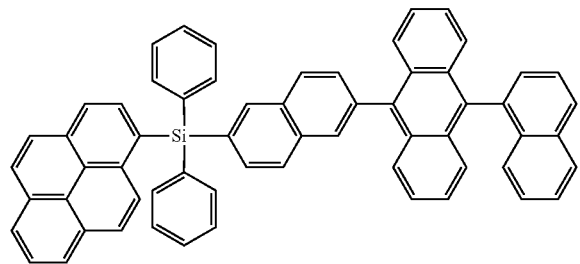

<Compound 31>

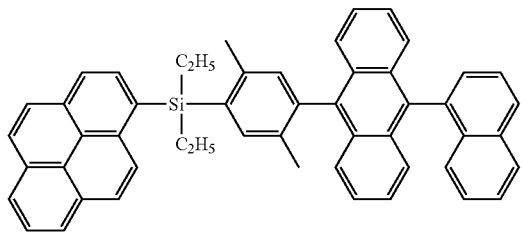

<Compound 32>

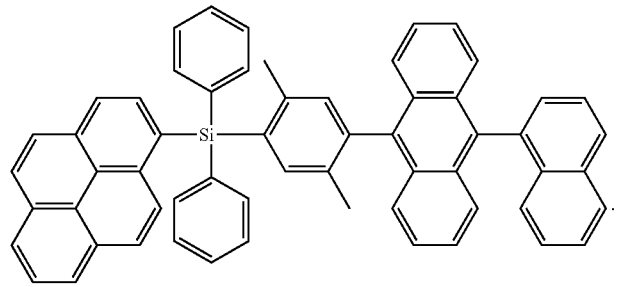

6. An organic light-emitting device, comprising: a first electrode; a second electrode opposite to the first electrode; and an organic layer between the first and second electrodes and including an emission layer, wherein the organic layer includes at least one anthracene-based compound as claimed in claim 1.

7. The organic light-emitting device as claimed in claim 6, wherein the organic layer includes a hole transport region between the first electrode and the emission layer, and an electron transport region between the emission layer and the second electrode, the hole transport region including at least one of a hole injection layer, a hole transport layer, a functional layer having both hole injection and hole transport capabilities, a buffer layer, and an electron blocking layer, and the electron transport region including at least one of a hole blocking layer, an electron transport layer, and an electron injection layer.

8. The organic light-emitting device as claimed in claim 6, wherein the at least one anthracene-based compound is present in the emission layer.

9. The organic light-emitting device as claimed in claim 8, wherein the emission layer further includes a dopant represented by Formula 100, and the at least one anthracene-based compound is a host:

<Formula 100>

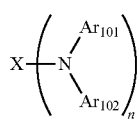

wherein, in Formula 100,

X is selected from i) a naphthalenyl group, a phenanthrenyl group, a pyrenyl group, an anthracenyl group, a chrysenyl group, a fluorenyl group, and a benzofluorenyl group, and ii) a naphthalenyl group, a phenanthrenyl group, a pyrenyl group, an anthracenyl group, a chrysenyl group, a fluorenyl group, and a benzofluorenyl group, each substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and a $C_1$-$C_{30}$ heteroaryl group;

$Ar_{101}$ and $Ar_{102}$ are each independently selected from i) a $C_6$-$C_{30}$ aryl group, and ii) a $C_6$-$C_{30}$ aryl group substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, a $C_1$-$C_{30}$ heteroaryl group, and —Si($Q_1$)($Q_2$)($Q_3$), where $Q_1$ to $Q_3$ are each independently selected from a $C_1$-$C_{30}$ alkyl group, and a $C_6$-$C_{30}$ aryl group; and n is an integer from 1 to 4.

* * * * *